United States Patent [19]

Miki et al.

[11] Patent Number: 5,099,146
[45] Date of Patent: Mar. 24, 1992

[54] CONTROLLED THRESHOLD TYPE ELECTRIC DEVICE AND COMPARATOR EMPLOYING THE SAME

[75] Inventors: Takahiro Miki; Shiro Hosotani; Toshio Kumamoto, all of Hyogo, Japan

[73] Assignee: Mitsubishi Denki Kabushiki Kaisha, Tokyo, Japan

[21] Appl. No.: 539,828

[22] Filed: Jun. 18, 1990

Related U.S. Application Data

[63] Continuation-in-part of Ser. No. 339,768, Apr. 18, 1989, abandoned.

[30] Foreign Application Priority Data

Apr. 18, 1988 [JP] Japan ................... 63-96266
Jun. 29, 1988 [JP] Japan ................... 63-162841

[51] Int. Cl.$^5$ ................ H03K 5/24; H03K 5/153
[52] U.S. Cl. ................. 307/350; 307/296.2; 307/296.8; 307/354; 307/491; 307/359; 307/362
[58] Field of Search ........ 307/350, 354, 296.2, 307/296.5, 296.8, 359, 362, 490, 491

[56] References Cited

U.S. PATENT DOCUMENTS 4,791,318 12/1988 Lewis et al. ................ 307/451

OTHER PUBLICATIONS

H. N. Leighton, "Back Gate Control Circuits", IBM Technical Disclosure Bulletin, vol. 27, No. 6, Nov. 1984, pp. 3607–3608.

Primary Examiner—John Zazworsky
Attorney, Agent, or Firm—Lowe, Price, LeBlanc & Becker

[57] ABSTRACT

In a controlled threshold type electric device having first and second transistors and a differential amplifier which receives a reference input voltage, a voltage corresponding to the threshold voltage of the first transistor itself is applied to the differential amplifier as a feedback input voltage. The differential amplifier compares the received feed back input voltage with the reference input voltage and applies a control voltage to the backgate of the first transistor so that the threshold value of the first transistor converges to a desired value. This control voltage is also applied to the backgate of the second transistor so that the threshold voltage of the second transistor also converges to a desired value. Since the voltage corresponding to the threshold value of the first transistor is applied to the differential amplifier, an accurate feed back control is made. Further, since the differential amplifier can be manufactured through the MOS standard process, the manufacturing cost can be reduced.

24 Claims, 10 Drawing Sheets $V_1' < V_1 < V_1''$

FIG. 10
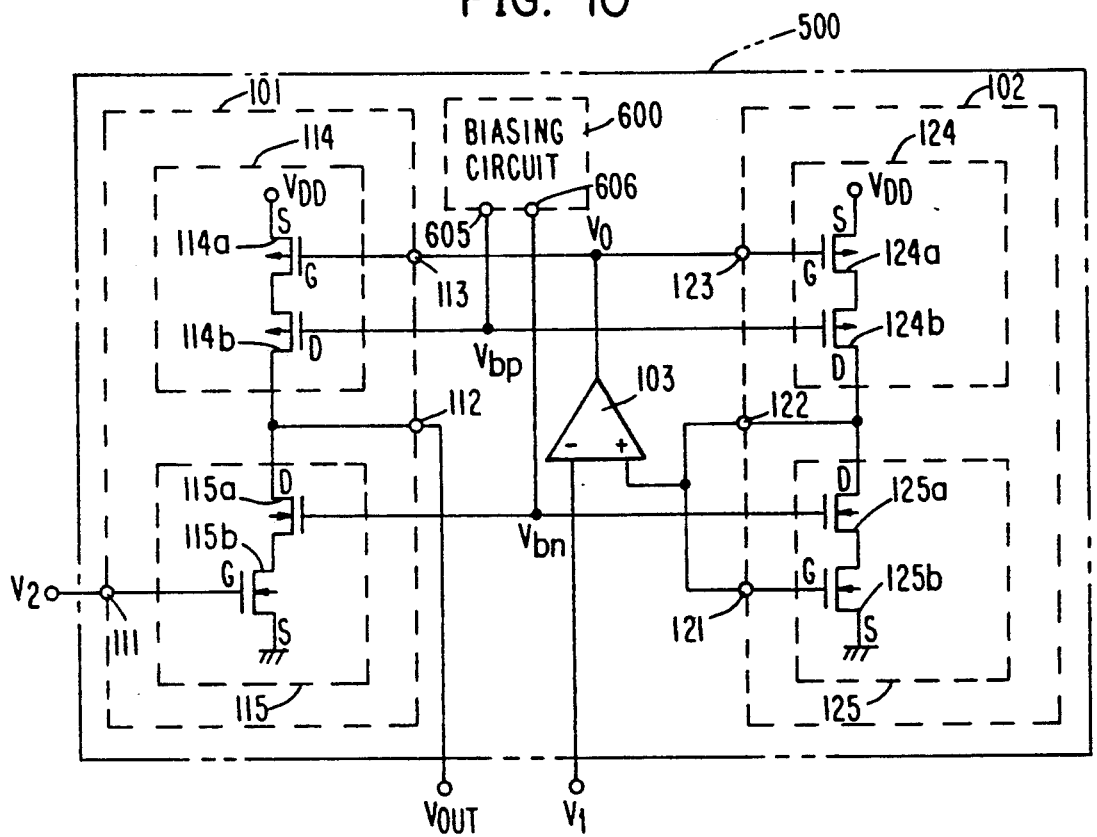
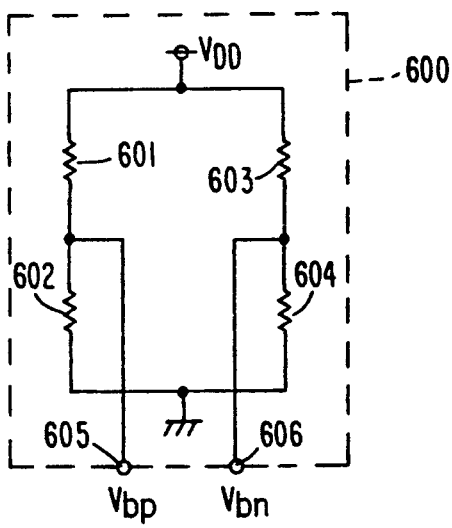
FIG. 11

CONTROLLED THRESHOLD TYPE ELECTRIC DEVICE AND COMPARATOR EMPLOYING THE SAME

CROSS REFERENCE TO RELATED APPLICATIONS

This is a continuation-in-part application of U.S. patent application Ser. No. 339,768, filed Apr. 18, 1989, now abandoned.

BACKGROUND OF THE INVENTION

1. Field of the Invention

The present invention generally relates to controlled threshold type electric devices and comparators employing the same. More particularly, the present invention relates to a controlled threshold type electric device which controls the threshold value of a transistor or the input threshold value of an amplifier through feedback control such that they converge to their desired values The present invention further relates to a comparator which compares, using such a controlled threshold type electric device, a reference input voltage and an external input voltage and outputs the result of comparison.

2. Description of the Background Art

A threshold voltage $V_T$ of an MOS (Metal Oxide Silicon) transistor or the like generally fluctuates depending on various parameters such as an initial threshold voltage $V_{TO}$ or substrate effect constant $\gamma$ which vary between different substrates. For example, the initial threshold voltage $V_{TO}$ may deviate from a desired value generally by about 100 mV to several 100 mV due to a slight difference of manufacturing conditions. Since accurate control of such parameters is difficult in manufacturing transistors, the threshold voltage $V_T$ requires some control based on measurements after the manufacturing to attain a desired value. To meet such requirement, for example, the technique described in U.S. Pat. No. 3,657,575 is generally known. FIG. 20 is a circuit diagram showing the controlled threshold type electric device described in this U.S. Pat. No. 3,657,575. Referring to the diagram, the conventional threshold controlled type electric device comprises a plurality of MOS transistors $T_1$ to $T_4$ and 1 and a control voltage generating means 40. The control voltage generating means 40 comprises a bipolar transistor 2, a diode 3 and resistors 5 and 4. The transistor 1 receives a reference voltage $E_R$ from a DC source 6 at its frontgate G. At its substrate as an example of the backgate, the transistor 1 receives a control voltage $V_2$ from the control voltage generating means 40. As a result, a backgate bias voltage $V_B$ is generated between the frontgate G and the backgate of the transistor 1. This backgate bias voltage $V_B$ can control the threshold of the transistor 1. The control voltage generating means 40 receives an operating voltage Vd which causes generation of a feedback input voltage $V_1$ at a terminal 48 and also generation of a drain current $I_D$ and a base current $I_B$. Assuming that the base current $I_B$ is substantially smaller than the drain current $I_D$, the feedback input voltage $V_1$ is represented as $V_1 = V_d - I_D \times R_L$, where $R_L$ is resistance value of the resistor 4. The drain current $I_D$ varies depending on magnitude of the threshold value of the transistor 1, which varies in turn depending on magnitude of the backgate bias voltage $V_B$. Further, the backgate bias voltage $V_B$ varies depending on magnitude of the control voltage $V_2$ generated by the control voltage generating means 40. A change in the drain current $I_D$ leads to a change in the feedback input voltage $V_1$. Since the feedback input voltage $V_1$ is applied to the base of the bipolar transistor 2 through the diode 3, the change in the feedback input voltage $V_1$ causes the control voltage $V_2$ to change correspondingly. Thus, a negative feedback loop is configured of the transistor 1 and the control voltage generating means 40 in which the threshold value of the transistor 1 is used as a controlled variable, the voltage $V_1$ generated at the terminal 48 as a feedback signal, and the control voltage $V_2$ as a control action signal. As a function of the negative feedback loop, the control voltage $V_2$ is applied to the backgate of the transistor 1 so that the threshold value of the transistor 1 may converge to its desired value, and the same control voltage $V_2$ is applied to the backgates of the other transistors $T_1$ to $T_4$. As a result, also those other transistors $T_1$ to $T_4$ are controlled such that their threshold values converge to the respective desired values in the same manner as the transistor 1. Consequently, deviation of the threshold values in manufacturing or that caused by a temperature change and the like in use can be prevented, keeping the threshold values of transistors at their desired values.

In the conventional threshold controlled type electric device shown in FIG. 20, the control voltage generating means 40 comprises the bipolar transistor 2. When a Bi. MOS process (bipolar element-MOS mixed process) is employed to obtain the bipolar element in manufacturing the controlled threshold type electric device, it will result in an increased cost. Meanwhile, though MOS standard process can not basically provide bipolar transistors, CMOS process can exceptionally provide them as parasitic elements. Since this CMOS process has not been optimized in itself for the production of bipolar transistors, the resulting bipolar transistors have low performance and require a considerable base current for operation. If the controlled threshold type electric device shown in FIG. 20 is realized using such an element, the base current $I_B$ take a relatively large value with respect to the drain current $I_D$, causing the following problems.

When a voltage drop by the diode 3 is shown as $V_D$, that by the bipolar transistor 2 as $V_{BE}$, and a threshold value corresponding to the backgate voltage $V_2$ (a function of $V_2$) as $V_{TH}(V_2)$, the expression of voltage drop along the resistor 4 having a resistance value $R_L$ will be given as follows.

$$R_L(I_B + I_D) = V_d - (V_2 + V_{BE} + V_D) \quad (1)$$

The expression showing the drain current of the transistor 1 is as follows:

$$I_D = \begin{cases} \dfrac{\beta}{2}(E_R - V_{TH}(V_2))^2 & \ldots E_R > V_{TH} \\ 0 & \ldots E_R \leq V_{TH} \end{cases} \quad (2)$$

where $\beta$ is a proportional constant. Therefore, when the drain current obtained from the expression (1) and that given by the expression (2) coincide with each other, the converged value of the threshold voltage $V_{TH}$ will satisfy the following expression.

$$\frac{V_d - (V_2 + V_{BE} + V_D)}{R_L} - I_B = \quad (3)$$

$$\begin{cases} \frac{\beta}{2}(E_R - V_{TH}(V_2))^2 & \dots E_R > V_{TH} \\ 0 & \dots E_R \leq V_{TH} \end{cases}$$

As described in the U.S. Pat. No. 3,657,575, only when the base current $I_V$ is small enough and the circuit has an amplifying function, that is, when $R_L$ is large enough, the left-side of the expression (3) becomes 0, and the threshold value $V_{TH}(V_2)$ meeting this relationship coincides with $E_R$. In other cases, however, $V_{TH}(V_2)$ does not coincide with $E_R$. Particularly when the base current $I_B$ is large, $V_2$ converges to a certain value irrespective of the transistor 1 being in the off-state. That is, $V_2$ converges to a value meeting the expression below irrespectively of $E_R$.

$$\frac{V_d - (V_2 + V_{BE} + V_D)}{R_L} - I_B = 0$$

As a result, there arises the problem that the threshold value $V_{TH}$ can not be controlled by the reference voltage $E_R$. The foregoing will be explained with reference to FIG. 21. FIG. 21 is a diagram for explaining occurrence of such a state where the reference voltage $E_R$ can not control the threshold value $V_{TH}$. In FIG. 21, the ordinate represents the drain current $I_d$ and the abscissa represents the control voltage $V_2$. A curve of solid line represents the drain current $I_d$ shown by the expression (2), a dashed line represents the drain current $I_d$ given by the expression (1) in the case of a large $R_L$ and a small $I_B$, and a two-dotted chain line represents the drain current $I_d$ given by the expression (1) in the case of a large $I_B$. When $R_L$ is large and $I_B$ is small as shown by the dashed line in FIG. 21, a desired value DV1 of the threshold value $V_{TH}$ coincides with the reference voltage $E_R$. When $I_B$ is large as shown by the two dotted chain line, however, a desired value DV2 of the threshold value $V_{TH}$ does not coincide with the reference voltage $E_R$. Consequently, the conventional controlled threshold type electric device requires a high-performance bipolar transistor which can not be manufactured through the conventional MOS standard process.

As another technique for making the input threshold voltage of an inverting amplifier or the like converge to a desired value, using feedback control, to prevent deviation of the input threshold value in manufacturing process or that caused by temperature and the like in use, and thus keeping the input threshold value always at the desired value, a controlled threshold type electric devices such as described in U.S. Pat. No. 4,791,318 and International Laying-Open Gazette of PCT application (International Laying-Open No. WO83/00785) is generally known. Such a conventional controlled threshold type electric device comprises two inverting amplifiers and one differential amplifier, in which the differential amplifier receives a voltage corresponding to the input threshold value of one inverting amplifier as a feedback input voltage and receives also a reference input voltage to compare the feedback input voltage and the reference input voltage, and then outputs such a control voltage as making the difference 0 to the inverting amplifier. That is, the one inverting amplifier and the differential amplifier constitute a negative feedback loop which exercises feedback control such that the input threshold value of the one inverting amplifier converges to its desired value, using the input threshold value of the one inverting amplifier as a controlled variable, the control voltage outputted from the differential amplifier as a control action signal, and a voltage corresponding to the input threshold value of the one inverting amplifier as a feedback signal. Through this feedback control, the control voltage is outputted from the differential amplifier which makes the input threshold value of the one inverting amplifier converge to its desired value (corresponding to the reference input voltage $V_1$). The same control voltage is applied also to the other inverting amplifier so that the input threshold value of the inverting amplifier is controlled likewise to attain its desired value.

In these conventional electric devices for controlling input threshold values, each inverting amplifier is formed of a series connection of voltage controlled current sources each comprising a single transistor or parallel-connected transistors, so that the amplification factor of the inverting amplifier does not amount to a large value. In the following, description will be made on the amplification factor of a general inverting amplifier.

Generally, a transistor itself functions as a voltage controlled current source. Thus, a change in the gate-source voltage causes a change in the drain current. If $\Delta V_G$, $\Delta V_S$ and $\Delta I_{D1}$ are change amounts in the gate potential, source potential and drain current, respectively, as shown in FIG. 15, the following relation is obtained:

$$\Delta I_{D1} = gm\,(\Delta V_G - \Delta V_S)$$

where gm is a proportional constant. If the drain-source voltage is changed, the drain current is also changed although slightly, due to a channel length modulation effect or the like. If the change amount in the drain current due to such effect is represented as $\Delta I_{D2}$ the following relation is obtained:

$$\Delta I_{D2} = go\,(\Delta V_D - \Delta V_S)$$

where $\Delta V_D$ is the change amount in the drain voltage and go is the proportionality constant. Accordingly, a total change amount $\Delta I_D$ in the drain current is expressed as follows:

$$\Delta I_D = \Delta I_{D1} + \Delta I_{D2} = gm\,(\Delta V_G - \Delta V_S) + go\,(\Delta V_D - \Delta V_S) \quad (4)$$

However, since the change amount of $V_{GS}$ contributes more to the change amount of $I_D$ than that of $V_{DS}$ as described above, the following relation is established:

$$gm >> go \quad (5)$$

The above description is related with respect to N-channel MOS transistors. The same phenomenon occurs also in P-channel MOS transistors. In the latter case, if the direction of the drain current is defined as shown in FIG. 16, the following expression is obtained:

$$\Delta I_D = -gm\,(\Delta V_G - \Delta V_S) - go\,(\Delta V_D - \Delta V_S) \quad (6)$$

Next, let us assume a case in which transistors are connected in series as shown in FIG. 17. In this case, certain voltages ($V_B$ and $V_R$) are applied to the gate of the transistor $Q_2$ and the source of the transistor $Q_1$. The change amount $\Delta I_{D1}$ of the drain current of the transistor $Q_1$ is represented as follows:

$$\begin{cases} \Delta I_{D1} = gm1\,(\Delta V_G - \Delta V_R) + go1\,(\Delta V_X - \Delta V_R) \\ \Delta V_R = 0 \end{cases}$$

Therefore, the following equation is obtained:

$$\Delta I_{D1} = gm1\,\Delta V_G + go1\,\Delta V_X \qquad (7)$$

The change amount $\Delta I_{D2}$ of the drain current of the transistor $Q_2$ is represented as follows:

$$\begin{cases} \Delta I_{D2} = gm2\,(\Delta V_B - \Delta V_X) + go2\,(\Delta V_{out} - \Delta V_X) \\ \Delta V_B = 0 \end{cases}$$

Therefore, the following equation is obtained:

$$\Delta I_{D2} = -gm2_{66}V_X + go2(\Delta V_{out} - \Delta V_X) \qquad (8)$$

Since the change amounts of the drain currents of both transistors $Q_1$ and $Q_2$ are coincident with $\Delta I_{out}$, the following equations are obtained from those equations (7) and (8).

$$\begin{cases} \Delta I_{out} = gm1\,\Delta V_{G1} + go1\,\Delta V_X & (9) \\ \Delta I_{out} = -gm2\,\Delta V_X + go2\,(\Delta V_{out} - \Delta V_X) & (10) \end{cases}$$

If $\Delta V_X$ is eliminated from the equations (9) and (10), the following equation is obtained.

$$I_{out} = \frac{gm2 + go2}{gm2 + go1 + go2}\,gm1\,\Delta V_G + \frac{go1\,go2}{gm2 + go1 + go2}\,\Delta V_{out}$$

If $go1$ and $go2$ are disregarded with respect to $gm1$ and $gm2$ from the equation (5), the following equation is obtained:

$$\Delta I_{out} = gm1\,\Delta V_G + \frac{go1\,go2}{gm2}\,\Delta V_{out} \qquad (11)$$

Comparing the equation (7) in the case of the transistor Q1 as a single device and the equation (11) in the case of using the transistors Q1 and Q2, the change amount of Iout with respect to the change amount of $V_G$ is the same and the change amount of Iout with respect to the change amount of Vout (or $V_X$) is suppressed.

Thus, from the expression (5), the following expression is obtained.

$$go1 >> go1\,\frac{go2}{gm2} \qquad (12)$$

Similarly, in the case of using P-channel MOS transistors, the following relation is obtained as shown in FIG. 18.

$$\Delta I_{out} = -gm1\,\Delta V_G - \frac{go1\,go2}{gm2}\,\Delta V_{out}$$

-continued $$go1 >> go1\,\frac{go2}{gm2}$$

The inverting amplifiers in the conventional controlled-threshold type electric device as described above are formed by series connection of voltage controlled current sources 40 and 42 and in view of the conductivity of each transistor, they are shown as in FIG. 19.

However, the change amounts $\Delta I_1$, $\Delta I_2$ of $I_1$, $I_2$ are expressed by the following equations.

$$\Delta I_1 = Gm_1 \Delta V_2 + Go_1 \Delta V_{out}$$

$$\Delta I_2 = Gm_2 \Delta V_o - Go_2 \Delta V_{out}$$

where $Gm_1$, $Gm_2$, $Go_1$ and $Go_2$ are constants having the same characteristics as $gm_1$, $gm_2$, $go_1$ and $go_2$, respectively.

Meanwhile, since Vo becomes constant after setting of the circuit, $\Delta V_o = 0$.

Since $I_1$ becomes equal to $\Delta I_2$, the following equation is obtained.

$$GM_1 \Delta V_2 + Go_1 \Delta V_{out} = -Go_2 \Delta V_{out}$$

Accordingly, the amplification factor AN is expressed as follows.

$$AN = \frac{\Delta V_{out}}{\Delta V_2} = \frac{Gm_1}{Go_1 + Go_2}$$

Now, since the change amount of Iout (Go1 or Go2) with respect to that of Vout of a single transistor is relatively large, the amplification factor AN of an inverting amplifier in the above-described conventional electric device for controlling input threshold value does not become so large.

FIG. 7 is a circuit diagram showing a general A/D converter. The A/D converter comprises a plurality of comparators 500 which compare a reference input voltage with an external input voltage to output the comparison result. The controlled threshold type electric device as described in the above-mentioned International Laying-Open Gazette of PCT Application (International Laying-Open No. WO83/00785) is applied to each of the comparators 500. As previously described, however, since this conventional controlled threshold type electric device does not have a sufficient amplification factor, that is, amplitude of the output voltage Vout, when applied to a comparator of the A/D converter, the device is subject to malfunctions due to noise and the like, and may prevent precise conversion from analog to digital.

SUMMARY OF THE INVENTION

An object of the present invention is to provide a controlled threshold type electric device which can prevent to the utmost those problems that make it impossible to control a threshold value toward a desired value, keeping down the manufacturing cost.

Another object of the present invention is to provide a controlled threshold type electric device which can prevent to the utmost those problems that make it impossible to control a threshold value toward a desired value and can be manufactured through the conventional MOS standard process.

Still another object of the present invention is to provide a controlled threshold type electric device which can prevent to the utmost any malfunction caused by noise and the like, when applied to a logic circuit.

Still another object of the present invention is to provide a controlled threshold type electric device which can make amplitude of an output signal as large as possible, when applied to a logic circuit.

Still a further object of the present invention is to prevent to the utmost the problem that an output signal is distorted by noise and the like in a comparator which compares a reference input voltage with an external input voltage to output the comparison result.

A controlled threshold type electric device according to the present invention comprises a differential amplifier, a first and a second transistors and threshold corresponding voltage applying means. The differential amplifier receives a reference input voltage and a feedback input voltage and amplifies the difference between both input voltages to output a control voltage. The first transistor comprises a frontgate and a backgate, and a first and a second conductive terminals and has a predetermined first threshold value. The first transistor receives the control voltage from the differential amplifier at the backgate to have the first threshold value controlled by the received control voltage. Depending on the relationship of magnitude between a voltage received at the frontgate and the first threshold voltage, a conductive or non-conductive state is established between the first and second conductive terminals. The second transistor comprises a frontgate and a backgate, and a first and a second conductive terminals, and has a predetermined second threshold value. The second transistor receives an external input voltage at the frontgate and the control voltage from the differential amplifier at the backgate so that the second threshold value is controlled by the received control voltage while maintaining a predetermined relationship with the first threshold value of the first transistor. Depending on the relationship of magnitude between the external input voltage received at the frontgate and the second threshold value, a conductive or non-conductive state is established between the first and second conductive terminals. The threshold corresponding voltage applying means includes small voltages supply-type threshold corresponding voltage applying means which has a node at which one of the first and second conductive terminals of the first transistor is connected with the frontgate, supplies a small current from the node to make it flow from one to the other of the first and second conductive terminals of the first transistor, and applies a voltage generated at the node supplying the small current, to the differential amplifier as the feedback input voltage.

In the controlled threshold type electric device according to the present invention, the differential amplifier and the first transistor constitute a feedback loop. The feedback loop exercises feedback control such that the threshold value of the first transistor converges to a desired value, using the threshold corresponding voltage outputted from the first transistor as a feedback signal, the reference input voltage applied to the differential amplifier as a reference input signal, the differential amplifier as a comparison portion, and the control voltage outputted from the differential amplifier as a control action signal. Since the comparison portion is constituted of a differential amplifier which can be manufactured through the general MOS standard process, the controlled threshold type electric device can be manufactured through the general MOS standard process, keeping down the manufacturing cost. It is well known, for example, from "Analysis and Design of Analog Integrated Circuits, Second Edition" by P. R. Gray et al, published by John Wiley and Sons Company, P708 and 743, that the differential amplifiers can be generally manufactured through the MOS standard process. For the threshold corresponding voltage applied to the differential amplifier as the feedback signal, the small current supply-type threshold corresponding voltage applying means exercises a precise feedback control so that a threshold corresponding voltage of precise value corresponding to the first threshold value of the first transistor is fed back to the differential amplifier. The control voltage based on that precise feedback control is also applied to the backgate of the second transistor to control the threshold value of the second transistor to converge to its desired value. As a result, the respective threshold values of the first and second transistors are controlled, based on the precise feedback control, toward their respective desired values, preventing to the utmost the problem that the threshold values get out of control.

A controlled threshold type electric device according to another aspect of the present invention comprises comparing means having a first and a second input portions for comparing a reference input voltage received at the first input portion with a feedback input voltage received at the second input portion to output a predetermined control voltage, a first amplifier receiving the control voltage from the comparing means and an external input voltage to output a predetermined output voltage, and a second amplifier having a transfer characteristic similar to that of the first amplifier and receiving the control voltage from the comparing means to apply a predetermined output voltage to the comparing means as the feedback input voltage. The first amplifier includes a series circuit which comprises a series connection of a first voltage controlled current source receiving a control voltage including the control voltage from the comparing means and providing a current controlled by the received control voltage and a second voltage controlled current source receiving a control voltage including the external input voltage and providing a current controlled by the received control voltage, and outputs a predetermined output voltage from a connection portion of the series connection. The second amplifier includes a series circuit which comprises a series connection of a first voltage controlled current source receiving a control voltage including the control voltage from the comparing means and providing a current controlled by the received control voltage and a second voltage controlled current source having a control voltage input portion and providing a current controlled by a control voltage including a voltage applied to the control voltage input portion, and a node at which a connection portion of the series connection and the control voltage input portion are connected to each other, for applying a voltage generated at the node to the comparing means as the feedback input voltage. The voltage controlled current sources comprised in the first amplifier and those in the second amplifier each include a multiple-transistor type voltage controlled current source having a plurality of transistors connected in series.

In the controlled threshold type electric device according to the present invention, the voltage generated at the node between the series-connected first and second voltage controlled current sources of the second amplifier serves as a threshold corresponding voltage which corresponds to the input threshold value of the second amplifier. A feedback loop is constituted of the comparing means and the second amplifier to exercise control such that the input threshold value of the second amplifier converges to its desired value, using the above-described threshold corresponding voltage as a feedback signal, the comparing means as a comparison portion, the reference input voltage as a reference input signal, and the control voltage outputted from the comparing means as a control action signal. The feedback loop exercises feedback control such that the comparing means outputs the control voltage which makes the input threshold value of the second amplifier converge to the desired value, and the same control voltage is also applied to the first amplifier to make the input threshold value of the first amplifier converge to its desired value. In addition, since the voltage controlled current sources comprised in the first amplifier and those comprised in the second amplifier each include a multiple-transistor type voltage controlled current source having a plurality of transistors connected in series, when they are applied to a logic circuit, the circuit outputs a signal with a relatively large amplitude. That is, as previously described, the amplification factor AN of an output signal will be given as follows.

$$AN = \frac{\Delta V_{out}}{\Delta V_2} = \frac{Gm1}{Go1 + Go2}$$

Thus, in the multiple-transistor type voltage controlled current source, the change amount of Iout (Go1 or Go2) with respect to that of Vout is considerably small when compared with a voltage controlled current source comprised of a single transistor. In an amplifier comprising the multiple-transistor type voltage controlled current sources, therefore, Go1+Go2 becomes smaller and the amplification factor AN becomes larger. As a result, when this controlled threshold type electric device is applied to a logic circuit, an output signal has a relatively large amplitude, preventing to the utmost malfunctions caused by noise and the like.

In a controlled threshold type electric device according to a preferred embodiment of the present invention, the first voltage controlled current sources comprised in the first and second amplifiers are each constituted of a multiple-transistor type voltage controlled current source, and the comparing means includes a differential amplifier which amplifies a difference between two input voltages and outputs the amplified result.

A comparator according to still another aspect of the present invention comprises comparing means and a first and a second amplifiers. The comparing means has a first input portion receiving a reference input voltage and a second input portion receiving a feedback input voltage, and compares the reference input voltage received at the first input portion and the feedback input voltage received at the second input portion to output a predetermined control voltage. The first amplifier receives the control voltage from the comparing means and an external input voltage to output a predetermined output voltage. Further, the first amplifier includes a series circuit which comprises a series connection of a first voltage controlled current source receiving a control voltage including the control voltage from the comparing means and providing a current controlled by the received control voltage and a second voltage controlled current source receiving a control voltage including the external input voltage and providing a current controlled by the received control voltage, and outputs a predetermined output voltage from a connection portion of the series connection. The second amplifier has a transfer characteristic similar to that of the first amplifier and receives the control voltage from the comparing means to output a predetermined output voltage to the second input portion of the comparing means as the feedback input voltage. Further, the second amplifier includes a series circuit which comprises a series connection of a first voltage controlled current source receiving a control voltage including that from the comparing means and providing a current controlled by the received control voltage and a second voltage controlled current source having a control voltage input portion and providing a current controlled by a control voltage including that received at the control voltage input portion, and a node at which a connection portion of the series connection and the control voltage input portion are connected to each other, for outputting a voltage generated at the node as the feedback input voltage. The voltage controlled current sources comprised in the first and second amplifiers each include a multiple-transistor type voltage controlled current source having a plurality of transistors connected in series.

In the comparator according to another aspect of the present invention, since the voltage controlled current sources comprised in the first and second amplifiers each include a multiple-transistor type voltage controlled current source, an output voltage from the series circuit of the first amplifier has a relatively large amplitude. As a result, in the comparator that compares the reference input input voltage and the external input voltage to output the comparison result, the problem that the output signal is distorted by noise and the like can be prevented to the utmost due to the large amplitude of the output signal.

According to a preferred embodiment of the present invention, the first and second voltage controlled current sources comprised in the first and second amplifiers each include a multiple-transistor type voltage controlled current source, and the comparing means includes a differential amplifier which amplifies a difference between two input voltages to output the amplified result.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 10 is a circuit diagram showing the controlled threshold type electric device according to the present invention and a comparator employing the same.

FIGS. 11 to 13 are circuit diagrams showing other examples of the bias voltage generating circuit shown in FIG. 10.

DESCRIPTION OF THE PREFERRED EMBODIMENTS

A detailed description will be made below on an embodiment of the present invention, with reference to the accompanying drawings.

Figure 1:
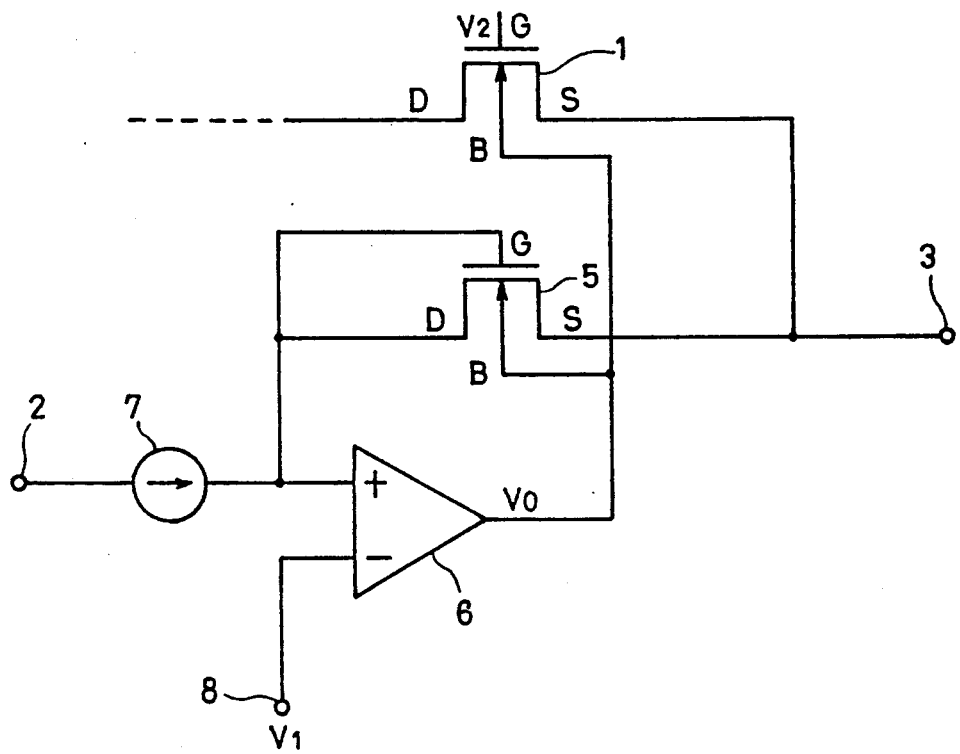
FIG. 1 is a circuit diagram showing an embodiment of the controlled threshold type electric device according to the present invention.

FIG. 1 is a circuit diagram showing an embodiment of a controlled threshold type electric device of the present invention. Respective sources S of an N-channel MOS transistor 1, which is an example of a first transistor, and of an N-channel MOS transistor 5, which is an example of a second transistor, are connected together to a terminal 3 to have the same potential. The sources S of the transistors 1 and 5 constitute second conductive terminals, respectively. A control voltage $V_0$ from a differential amplifier 6 which is an example of differential amplifying means is inputted to each backgate B, which is an example of a second control electrode. This differential amplifier 6 is manufactured through the MOS standard process. The gate G is an example of a first control electrode and the drain D which is an example of a first conductive terminal of the N-channel MOS transistor 5 are connected together to a positive input terminal of the differential amplifier 6. A current source 7 which is an example of current supplying means has its input connected to an input terminal 2 and its output connected to the positive input terminal of the differential amplifier 6. A reference input voltage $V_1$ is inputted from a terminal 8 to a negative input terminal of the differential amplifier 6. The gate G which is an example of the first control electrode of the N-channel MOS transistor 1 and the drain D which is an example of the first conductive terminal are connected to a circuit, not shown, and an external input voltage $V_2$ is inputted to the gate G.

Figure 2A:
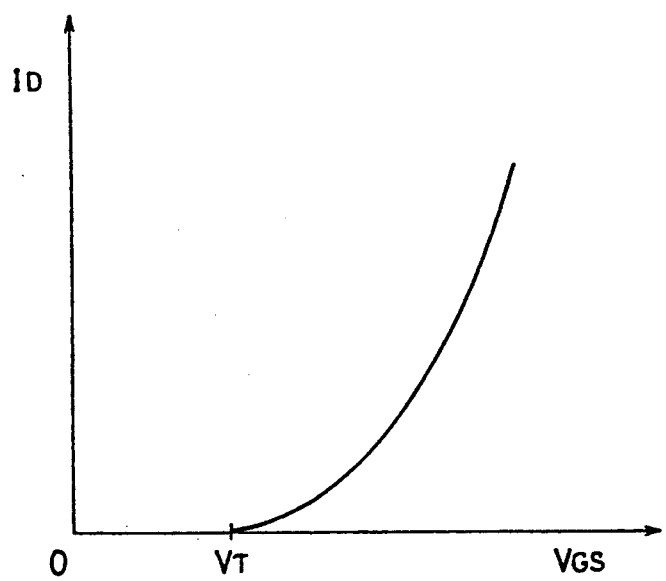
FIG. 2A is a diagram showing characteristics of an MOS transistor.
Figure 2B:
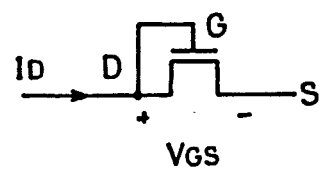
FIG. 2B is a schematic diagram of a diode-connected MOS transistor.

The operation will be described in the following. Each voltage value is a potential difference relative to a source S, which is either positive or negative, unless specially mentioned. A drain current from the current source 7 flows through the N-channel MOS transistor 5 having its gate G and drain D connected to each other (hereinafter referred to as "diode-connection"), and a voltage dependent on a threshold voltage $V_T$ of the N-channel MOS transistor 5 is generated at the drain D of the N-channel MOS transistor 5. Description will be given of a case in which the N-channel MOS transistor 5 is an enhancement type. FIG. 2A is a graph showing a relation between a drain current $I_D$ and a gate-source voltage $V_{GS}$ of a diode-connected enhancement type transistor shown in FIG. 2B. The relation is represented by the following equation (22).

$$I_D = \begin{cases} 0 & (V_{GS} < V_T) \\ \frac{\beta}{2}(V_{GS} - V_T)^2 & (V_{GS} \geq V_T) \end{cases} \quad (22)$$

In the equation (22), the reference character $\beta$ represents a coefficient. The equation (22) is modified to provide the following equation (23).
T,0300
In the equation (23), when the drain current $I_D$ is very small, the gate-source voltage $V_{GS}$ which is the potential of the gate G with the source S being the reference becomes approximately equal to the threshold voltage $V_T$. Since the gate G and the drain D of the N-channel MOS transistor 5 are connected to each other, the drain-source voltage $V_{DS}$ which is the potential of the drain D with the source S being the reference becomes equal to the threshold voltage $V_T$, whereby the threshold voltage $V_T$ is generated at the drain D.

The threshold voltage $V_T$ generated as the drain-source voltage $V_{DS}$ of the N-channel MOS transistor 5 is also inputted to the positive input terminal of the differential amplifier 6. The reference input voltage $V_1$ is applied from the terminal 8 to the negative input terminal of the diffferential amplifier 6. Therefore, a control voltage $V_0$ outputted from the differential amplifier 6 will be represented by the following equation (24) where the gain of the differential amplifier 6 is represented by a reference character A.

$$V_0 = A(V_T - V_1) + V_{00} \quad (24)$$

where the reference character $V_{00}$ is an output of the differential amplifier when $V_T = V_1$.

The output $V_0$ is applied to the backgate B of the N-channel MOS transistor 5.

A voltage between the source and backgate (a source-backgate voltage) $V_{SB}$ of the N-channel MOS transistor 5 is a potential of the source S with the backgate B being a reference. The source-backgate voltage $V_{SB}$ is controlled by the control voltage $V_0$. It is known that the relation between the source-backgate voltage $V_{SB}$ and the threshold voltage $V_T$ can be represented by the following equation (19) (more specifically, (19a) and (19b)). The threshold voltage $V_T$ of an N-channel MOS transistor is represented by the following equation (see "Analysis and Design of Analog Integrated Circuits (Second Edition)", P. R. Gray et al., published by John Wiley and Sons p. 63).

$$V_T = V_{TO} + \gamma(\sqrt{2\phi + V_{SB}} - \sqrt{2\phi_f}) \tag{19a}$$

The threshold voltage $V_T$ of a P-channel MOS transistor is represented by the following equation.

$$V_T = V_{TO} - \gamma(\sqrt{2|\phi_f| - V_{SB}} - \sqrt{2|\phi_f|}) \tag{19b}$$

In the equations (19a) and (19b), the reference character $V_{TO}$ represents the initial threshold voltage when the source-backgate voltage $V_{SB}=0$, the reference character $\phi_f$ represents a Fermi level of a substrate or a well corresponding to the backgate region (more accurately, a difference between an intrinsic Fermi level and the Fermi level), and the reference character $\gamma$ represents a positive constant which is called a substrate effect constant.

In the equations (19a) and (19b) above, the source-backgate voltage $V_{SB}$ is considered as the potential of the source S with the backgate B being the reference, so that $V_0 = -V_{SB}$. Accordingly, the equation (24) is transformed to provide the following equation (25).

$$V_{SB} = -A(V_T - V_1) - V_{00} \tag{25}$$

Description will be made on an operation in the case of the threshold voltage $V_T$ being higher than the reference input voltage $V_1$ in the equations (19a) and (25). In the equation (25) the gain A is a positive value and $V_T > V_1$, therefore $V_{SB}$ will be smaller than in the case where $V_T = V_1$. In an N-channel MOS transistor, when the source-backgate voltage $V_{SB}$ is reduced, the voltage $V_T$ tends to be lower according to the equation (19a). On the contrary, when the threshold voltage $V_T$ is lower than the reference input voltage $V_1$, threshold voltage $V_T$ tends to be higher in the similar manner. In this manner, a negative feed back loop is formed by a closed loop including the differential amplifier 6 and the N-channel MOS transistor 5, with the threshold voltage $V_T$ being the amount of control and the reference input voltage $V_1$ being the desired value, and the circuit is balanced when the voltage of the positive and negative input terminals of the differential amplifier 6 are equal to each other. The operation is well known as a virtual grounding function of the differential amplifier. The fact that the voltages of the positive and negative input terminals of the differential amplifier 6 become equal to each other can be described by the following equations.

When the equation (19a) is transformed employing the equation (25), the following equation (26) is provided.

$$V_T = V_{TO} + \gamma(\sqrt{2\phi_f - A(V_T - V_1) - V_{00}} - \sqrt{2\phi_f}) \tag{26}$$

Thus, $$\frac{V_T}{\sqrt{A}} = \frac{V_{\gamma O}}{\sqrt{A}} + \gamma \left( \sqrt{\frac{2\phi_f}{A} - (V_T - V_1) - \frac{V_{00}}{A}} - \sqrt{\frac{2\phi_f}{A}} \right)$$

In the equation (26), when the gain A of the differential amplifier 6 is very large and considered as $A = \infty$, the following equation (27) is provided.

$$O = \gamma \sqrt{-(V_T - V_1)} \tag{27}$$

Consequently, $V_T = V_1$.

As described above, in the circuit comprising the N-channel MOS transistor 5, the differential amplifier 6 and the current source 7, the source-backgate voltage $V_{SB}$ which makes the threshold voltage $V_T$ of the transistor 5 equal to the reference input voltage $V_1$ is inputted form the differential amplifier 6 to the backgate B of the N-channel MOS transistor 5 as the control $V_0$. Since the control voltage $V_0$ is also inputted to the backgate B of the N-channel MOS transistor 1, the threshold voltage $V_T$ of the N-channel MOS transistor 1 will be equal to the reference input voltage $V_1$ provided that the characteristics of the N-channel MOS transistors 1 and 5 on the same substrate are the same. In this manner, the threshold voltage $V_T$ of any desired transistor on the same substrate can be made equal to the reference input voltage $V_1$ constantly. When the threshold of the N-channel MOS transistor 1 is controlled such that it is equal to the reference input voltage $V_1$ and an external input voltage $V_2$ is inputted to the gate G of the N-channel MOS transistor 1, the N-channel MOS transistor 1 becomes conductive when the control input voltage $V_2$ is larger, and the N-channel MOS transistor 1 becomes non-conductive when the external input voltage $V_2$ is smaller, with reference to the threshold of the N-channel MOS transistor.

The differential amplifier 6 constitutes comparing means which receives the reference input voltage and the feedback input voltage to compare the two input voltages and outputs a predetermined control voltage. The N-channel MOS transistor 1 constitutes voltage responding means which has a predetermined first threshold value and receives the control voltage from the comparing means and an external input voltage, whereby the first threshold value is controlled by the above-mentioned control voltage. The state of the voltage responding means changes depending on the relationship of magnitude between the first threshold value and the external input voltage. Threshold corresponding voltage output means is formed by said N-channel MOS transistor 5, which has a predetermined second threshold, receiving said control voltage outputted from said comparing means for outputting a threshold corresponding voltage whose value corresponds to said second threshold, said second threshold being controlled by said control voltage while maintaining a predetermined relation with said first threshold of said voltage responding means. Further, a feed back loop is formed by a closed loop including the N-channel MOS transistor 5 which feeds back the threshold corresponding voltage outputted form the said threshold corresponding voltage output means as a feed back voltage to the said comparing means and controls the said control voltage such that the said first threshold of the said voltage responding means converges to a desired value.

Figure 3:
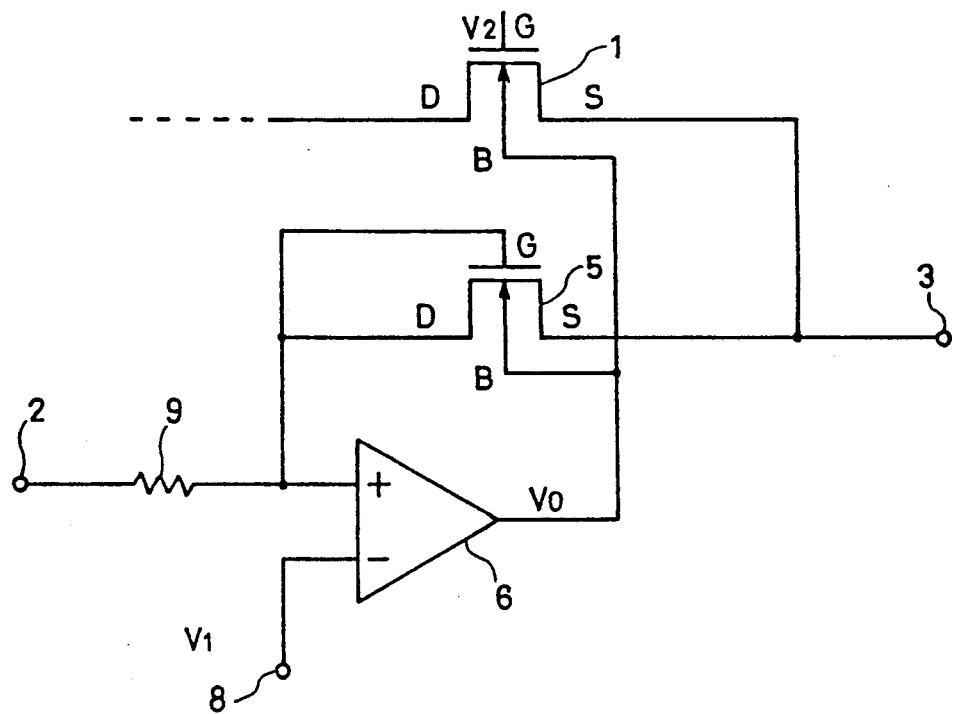
FIGS. 3 and 4 are circuit diagrams showing other embodiments of the controlled threshold type electric device according to the present invention.

FIG. 3 is a circuit diagram showing another embodiment of a controlled threshold type electric device in which a resistor 9 is employed instead of the current source 7 shown in FIG. 1. In FIG. 3, the same reference characters as FIG. 1 represent the same components having the same functions, and therefore detailed descriptions thereof are not repeated here. The controlled threshold type electric device shown in FIG. 3 operates in the similar manner as the controlled threshold type electric device shown in FIG. 1 by converting a voltage received at the input terminal 2 into a small current through the resistor 9, An element having the same function as the resistor 9, for example a diode-connected transistor may be used instead of the resistor 9.

Figure 4:
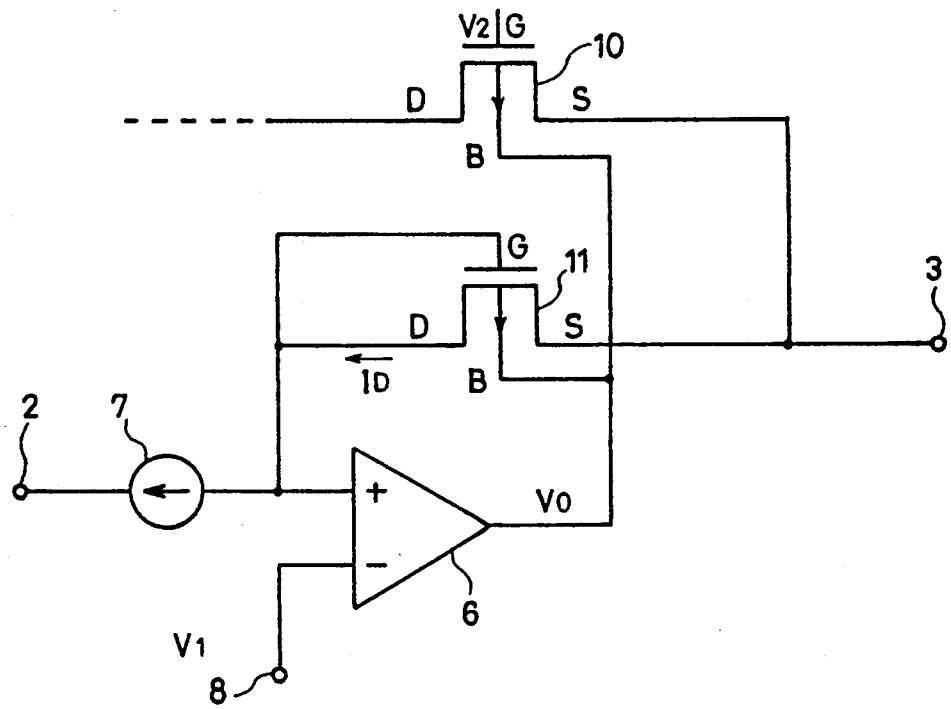

FIG. 4 is a circuit diagram showing one embodiment of a controlled threshold type electric device employing P-channel MOS transistors. In FIG. 4, the same reference characters as FIG. 1 represent the same components having the same functions, so that detailed descriptions thereof are not repeated here. Instead of the N-channel MOS transistors 1 and 5 shown in FIG. 1, P-channel MOS transistors 10 and 11 are connected. The input of the current source 7 which is an example of the current supplying means is connected to the positive input terminal of the differential amplifier 6 which is an example of the comparing means, and the output is connected to the input terminal 2. Except these points, the structure is the same as the controlled threshold type electric device employing N-channel MOS transistors shown in FIG. 1.

The operation will be described in the following. It is assumed that the drain current $I_D$ of the current source 7 is very small. As in the case of th above-described N-channel MOS transistor, the drain-source voltage $V_{DS}$ of the P-channel MOS transistor 11 becomes the threshold voltage $V_T$. In the case of the P-channel MOS transistor, the threshold voltage $V_T$ is the potential of the gate G with the source S being a reference, and the said threshold voltage $V_T$ becomes a negative value when the P-channel MOS transistor is of the enhancement-type.

When the threshold voltage $V_T$ of the P-channel MOS transistor 11 is higher than the reference input voltage $V_1$, the control voltage $V_0$ becomes larger than a value taken when $V_T=V_1$ as in the case of the above-described N-channel MOS transistor, and the source-backgate voltage $V_{SB}$ becomes smaller than a value taken when $V_T=V_1$. When the source-backgate voltage $V_{SB}$ decreases, the threshold voltage $V_t$ tends to be lowered according to the equation (19b). On the contrary, when the threshold voltage $V_T$ is lower than the reference input voltage $V_1$, the threshold voltage $V_T$ tends to be raised. In this manner, the threshold voltage $V_T$ and the reference input voltage $V_1$ become equal to each other by the function of the negative feed back loop.

Namely, in the controlled threshold type electric device shown in FIG. 4, voltage responding means is formed by the P-channel MOS transistor 10 as an example of the first transistor, the voltage responding means having a predetermined first threshold, receiving said control voltage form said comparing means and an external input voltage, said first threshold controlled by said control voltage. Threshold corresponding voltage output means is formed by the P-channel MOS transistor 11 as an example of the second transistor, the said threshold corresponding voltage outputting means having a predetermined second threshold, receiving said control voltage outputted from said comparing means for outputting a threshold corresponding voltage whose value corresponds to said second threshold, said second threshold being controlled by said control voltage while maintaining a predetermined relation with said first threshold of said voltage responding means, said threshold corresponding voltage fed back as said feed back voltage to said comparing means.

Meanwhile, in the controlled threshold type electric devices shown in FIGS. 1 to 4, the first transistor is formed of one MOS transistor 1 or 10. However, the first transistor may be formed of a plurality of MOS transistors, with the control voltage $V_0$ from the differential amplifier 6 inputted to the respective backgates. Although MOS transistors are shown in FIG. 1 to 4, MIS transistors may be employed.

Figure 5:
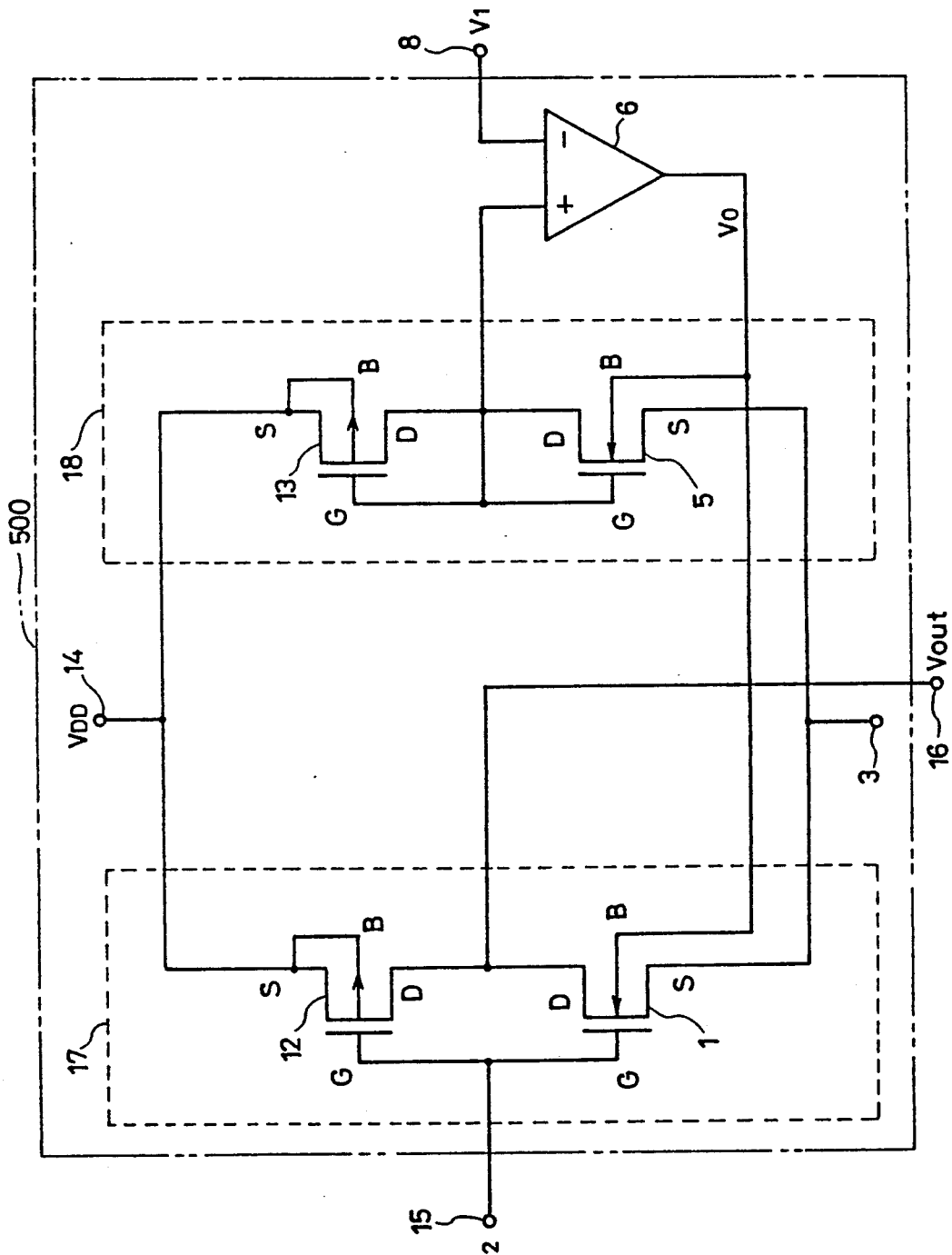
FIG. 5 is a circuit diagram showing a controlled threshold type electric device and a comparator employing the same.

FIG. 5 is a circuit diagram showing a further example of the controlled threshold type electric device in accordance with the present invention. Referring to the diagram, the sources S of the N-channel MOS transistors 1 and 5, which are in turn examples of the first voltage controlled current source, are connected together to a terminal 3 to have the same potential. The backgates B which are examples of the second driving voltage input portions, of the N-channel MOS transistors 1 and 5 are connected together to an output portion of a differential amplifier 6 which is an example of the differential amplifying means to receive a control voltage $V_0$. The sources S which are examples of the input portions of the P-channel MOS transistors 12 and 13 which are in turn examples of the second voltage controlled current sources, and the backgates B which are examples of the driving voltage input portions are connected together to the terminal 14 to receive a supply voltage $V_{DD}$. The gate G which is an example of the first driving voltage input portion of the N-channel MOS transistor 1 and the gate G which is an example of the first driving voltage input portion of the P-channel MOS transistor 12 are connected together to an input terminal 15 to receive an external input voltage $V_2$. The drain D which is an example of an output portion of the N-channel MOS transistor 1 and the drain D which is an example of the output portion of the P-channel MOS transistor 12 are connected together to an output terminal 16 to output an output voltage $V_{out}$. The N-channel MOS transistor 1 and the P-channel MOS transistor 12 constitute an inverting amplifier 17. The gates G which are examples of th first driving voltage input portions of the transistors 5 and 13, and the drains which are the examples of th output portions are connected together to the positive input terminal of the differential amplifier 6 which is an example of the differential amplifying means. The N-channel MOS transistor 5 and the P-channel MOS transistor 13 constitute an inverting amplifier 18. The reference input voltage $V_1$ is applied from the terminal 8 to the negative input terminal of the differential amplifier 6.

Figure 6:
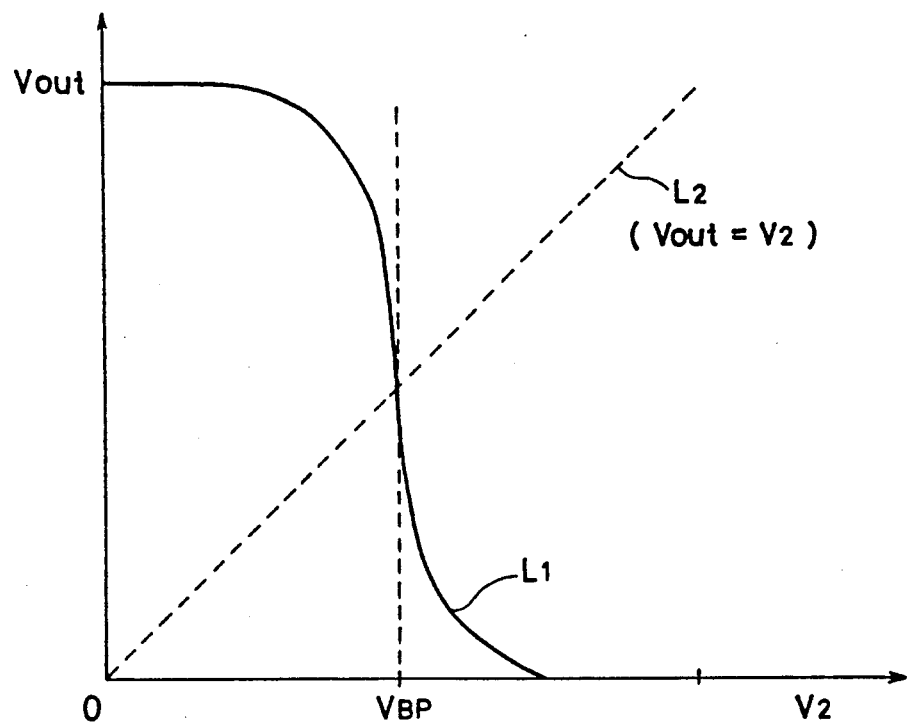
FIG. 6 is a diagram showing input/output characteristics of the inverting amplifier shown in FIG. 5.

The operation will be described in the following. FIG. 6 is a graph showing general input/output characteristics of the said inverting amplifiers. At an intersection of a transfer curve $L_1$ and a line $L_2$ ($V_2=V_{out}$), the transfer curve $L_1$ inclines steeply. The value at this intersection is defined as an input threshold $V_{BP}$. It is well known that the input threshold $V_{BP}$ has a close relation with the threshold of each transistor, which is represented by the following equation (28) (see, for example, "Principles of CMOS VLSI Design", Neil H. E. Weste et al, published by Addison-Wesley Publishing Company, p. 47).

$$V_{BP} = \frac{V_{DD} + V_{tp} + V_{tn}\sqrt{\beta_n/\beta_p}}{1 + \sqrt{\beta_n/\beta_p}} \tag{28}$$

In the equation (28), the reference character $V_{DD}$ represents a supply voltage, which corresponds to the potential of the terminal 14 with the terminal 3 being the reference in FIG. 5. The reference character $V_{tn}$ represents the threshold voltage of the N-channel MOS transistor, the reference character $V_{tp}$ represents the threshold voltage of the P-channel MOS transistor, and the reference characters $\beta_n$ and $\beta_p$ are constants.

In the case of the inverting amplifier 18 having the input and the output portion connected to each other as shown in FIG. 5, a balanced point of the circuit is given as the intersection of a curve representing transfer function of the circuit ( referred to as "transfer curve" hereinafter) or $L_1$ and the line $L_2$. Namely, the output of the inverting amplifier 18 becomes the input threshold $V_{BP}$ and inputted to the positive input terminal of the differential amplifier 6. If the input threshold $V_{BP}$ is higher than the reference input voltage $V_1$, the control voltage $V_0$ outputted from the differential amplifier 6 becomes higher than a value taken when $V_{BP}=V_1$, and the threshold $V_T$ of the N-channel MOS transistor 5 becomes lower Since the threshold $V_{tn}$ of the N-channel MOS transistor becomes lower in the equation (28), the input threshold $V_{BP}$ also tends to be lower. On the contrary, if the input threshold $V_{BP}$ is lower than the reference input voltage $V_1$, the control voltage $V_0$ outputted from the differential amplifier 6 becomes lower than a value taken when $V_{BP}=V_1$, and the input threshold $V_{BP}$ becomes higher.

Since the differential amplifier 6 and the N-channel MOS transistor 5 constitute a negative feed back loop as described above, the input threshold $V_{BP}$ and the reference input voltage $V_1$ become equal to each other due to the virtual grounding function.

If the N-channel MOS transistors 1 and 5 and the P-channel MOS transistors 12 and 13 have the same size, and if the inverting amplifiers 17 and 18 are designed to have the same input/output characteristics, the N-channel MOS transistors 1 and 5 have the same source-backgate voltage $V_{SB}$, so that the inverting amplifiers 17 and 18 have the same input threshold $V_{BP}$. More specifically, the input threshold $V_{BP}$ determining whether the output $V_{out}$ of the inverting amplifier 17 is at the "H" level or at the "L" level will be equal to the reference input voltage $V_1$ and the transfer curve $L_1$ of FIG. 6 corresponds to the reference input voltage $V_1$. An input threshold $V_{BP}$ corresponding to the reference input voltage $V_1$ is set, the external input voltage $V_2$ is distinguished from the predetermined input threshold $V_{BP}$, and a signal of high level or low level is outputted from the output terminal 16 depending on whether the external input voltage $V_2$ is larger than or smaller than predetermined input threshold $V_{BP}$.

The comparing means is formed by the said differential amplifier 6 shown in FIG. 5, which receives the reference input voltage and the feed back input voltage and compares to both input voltages to output a predetermined control voltage. Voltage responding means is formed by the said inverting amplifier 17 which has a predetermined first threshold, receives said control voltage form said comparing means and an external input voltage, said first threshold for determining magnitude of the external input voltage being controlled by said control voltage.

Threshold corresponding voltage output means is constituted by the said inverting amplifier 18 which has a predetermined second threshold, receiving said control voltage outputted from said comparing means for outputting a threshold corresponding voltage whose value corresponds to said second threshold, said second threshold being controlled by said control voltage while maintaining a predetermined relation with said first threshold of said voltage responding means, and feeding back said second threshold voltage to said comparing means as said feed back voltage. A feed back loop is formed by a closed loop including the said inverting amplifier 18, which feeds back the threshold corresponding voltage outputted from the said threshold corresponding voltage output means to the said comparing means as the feedback voltage for controlling the said control voltage such that the said first threshold of the said voltage responding means converges to a desired value.

The controlled threshold type electric device shown in FIG. 5 may be applied to a comparator which determines the magnitude of an external input voltage based on a reference input voltage to output the result of determination.

Figure 7:
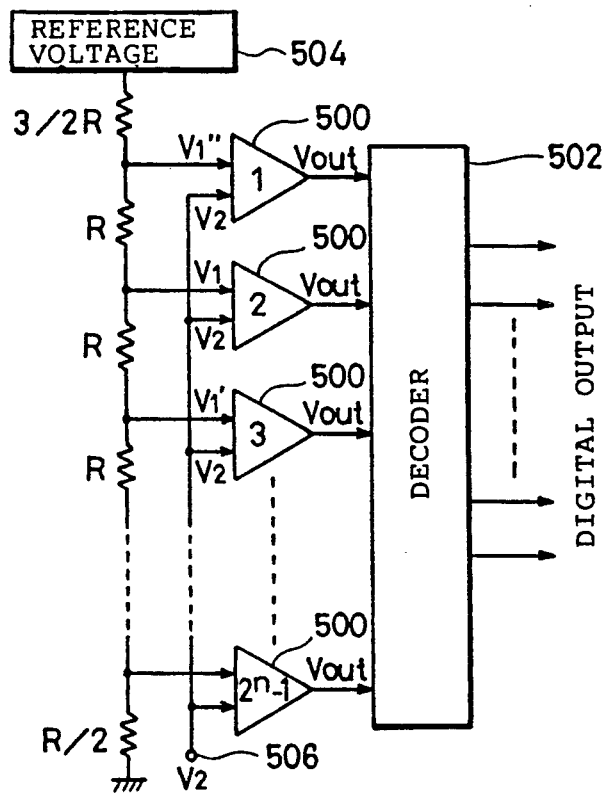
FIG. 7 is a block diagram showing an A/D converter to which the comparators according to the present invention are applied.

FIG. 7 is a circuit diagram showing an A/D converter. A parallel type A/D converter shown in FIG. 7 comprises a plurality of comparators 500 which receive reference input voltages $V''_1, V_1, V'_1...$ from a reference voltage 504 and an external input voltage $V_2$ from an analog input portion 506 and compare the magnitude of the inputted voltages. The comparator 500 is formed by the said controlled threshold type electric device shown in FIG. 5. The parallel type A/D converter shown in FIG. 7 converts analog signals to digital signals. Namely, it takes an input analog signal at a certain timing and converts the voltage (current) value at that time into a digital value with a predetermined bit number. The parallel type A/D converter employed $2^n-1$ comparators for N-bit quantization, as shown in FIG. 7. In case of 8-bit quantization, a voltage provided by dividing the reference voltage by means of $2^8-1=255$ comparators in 1LSB unit is compared with the external input voltage $V_2$, and the result of comparison is converted into a 8-bit digital output by a decoder 502.

Where the controlled threshold type electric device shown in FIG. 5 is used as a comparator as shown in FIG. 7, means for determining magnitude of the external input voltage is formed by the inverting amplifier 17 shown in FIG. 5, which has a predetermined logic determining threshold, receives the said control voltage form the said comparing means and the external input voltage, and outputs the result of determination of the magnitude of the said external input voltage with the said logic determining threshold being a reference, with the said logic determining threshold being controlled by the said inputted control voltage.

Figure 8:
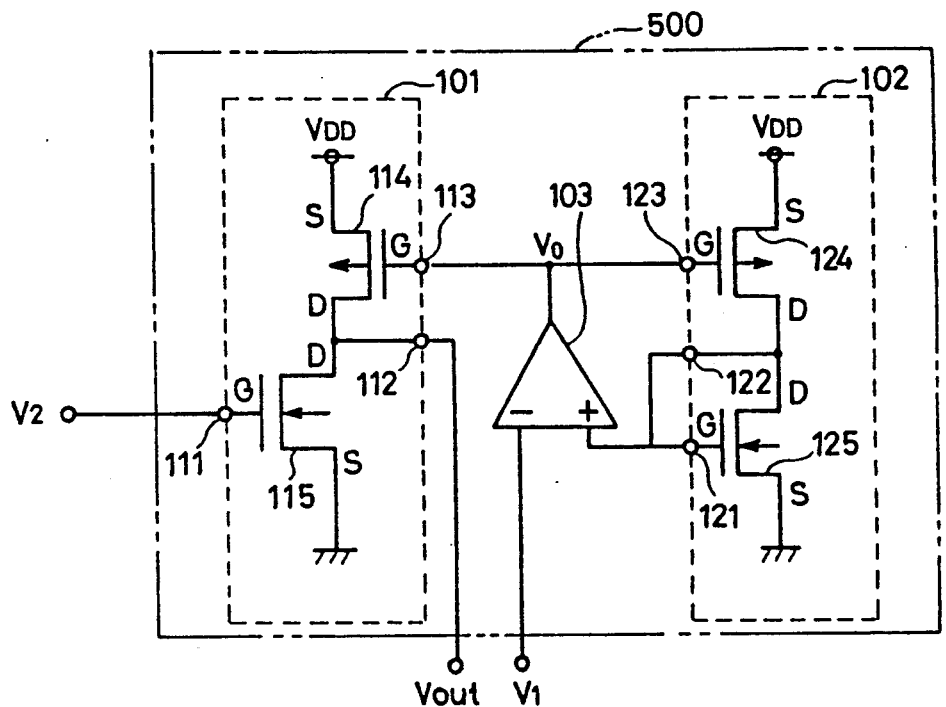
FIG. 8 is a circuit diagram showing a controlled threshold type electric device and another example of comparator employing the same.

FIG. 8 is a circuit diagram showing a further example of the controlled threshold type electric device in accordance with the present invention.

Referring to FIG. 8, the reference numeral 114 represents a P-channel MOS transistor which is an example of a second voltage controlled current source and the reference numeral 115 represents an N-channel MOS transistor which is an example of a first voltage controlled current source. The drains D of these transistors which are examples of the output portions thereof are connected to each other to provide an output terminal 112 of an inverting amplifier 101. The gate G which is an example of a driving control voltage input portion of the N-channel MOS transistor 115 constitutes an input terminal 111 of the inverting amplifier 101, and the gate G which is an example of the driving voltage input portion of the P-channel MOS transistor 114 constitutes a bias voltage input terminal 113 of the inverting amplifier 101. Similarly, a P-channel MOS transistor 124 which is an example of the second voltage controlled current source and an N-channel MOS transistor 125 which is an example of the first voltage controlled current source constitute an inverting amplifier 102, and the input terminal, the output terminal and the bias voltage input terminal are respectively formed of the terminals 121, 122, and 123.

The bias voltage input terminals 113 and 123 of the inverting amplifiers 101 and 102 are coupled together to an output portion of a differential amplifier 103 which is an example of the differential amplifying means. The input and output terminals 121 and 122 of the inverting amplifier 102 are coupled to a positive input terminal of the differential amplifier 103, and a signal from the inverting amplifier 102 is inputted to the said differential amplifier 103 as a feedback signal. This differential amplifier 103 is manufactured through the MOS standard process.

The reference input voltage $V_1$ is inputted to a negative input terminal of the differential amplifier 103, and the external input voltage $V_2$ is inputted to the input terminal 111 of the said inverting amplifier 101.

The operation will be described in the following.

When the reference input voltage $V_1$ is inputted to the negative input terminal side of the differential amplifier 103, a signal provided by amplifying a difference between the reference input voltage $V_1$ and the input voltage inputted to the positive input terminal side of the differential amplifier is inputted to the bias voltage input terminals of the said inverting amplifiers 101 and 102 as a control voltage $V_0$. In the both inverting amplifiers 101 and 102, the point at which the output voltage $V_{out}$ change largely in accordance with a slight change of the external input voltage $V_2$, that is, the input threshold can be controlled by the magnitude of the said control voltage $V_0$, as described above.

Figure 9:
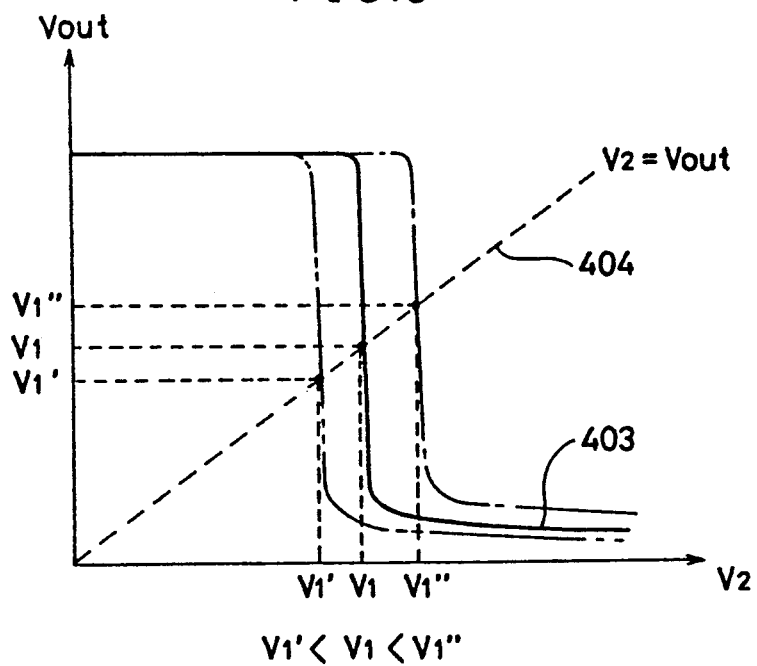
FIG. 9 is a diagram showing input/output characteristics of the inverting amplifier shown in FIG. 8.

A curve 403 shown in FIG. 9 shows the transfer curve of the inverting amplifiers 101 and 102. Since the P-channel MOS transistors 114 and 124 are always conductive, the output voltage $V_{out}$ is slightly higher than the ground voltage even if the external input voltage $V_2$ is high. Since the input and output terminals 121 and 122 of the inverting amplifier 102 are connected to each other, the potentials of the output terminal 122 and the input terminal 121 are provided at the intersection of the transfer curve 403 and the line on which the reference input voltage $V_1$=output voltage $V_{out}$, as shown in FIG. 9. Therefore, the threshold voltage representing the input threshold of the inverting amplifier 102 is inputted to the positive input terminal of the differential amplifier 103. Meanwhile, since the bias voltage input terminal 123 of the inverting amplifier 102 is connected to the output portion of the differential amplifier 103, a negative feed back loop is formed by the closed loop including the inverting amplifier 102. Therefore, the control voltage $V_0$ is controlled due to the virtual grounding function such that the voltage applied to the positive and negative input terminals of the differential amplifier 103 become equal to each other. More specifically, when the potential of the output terminal 122 is higher than the reference input voltage $V_1$, the control voltage $V_0$ is controlled such that the potential of the control voltage $V_0$ rises to reduce the bias current. Consequently, the potential of the output terminal 122 is lowered. If the potential of the output terminal 122 is lower than the reference input voltage $V_1$, the potential of the control voltage $V_0$ inputted to the bias voltage input terminal 123 decreases to increase the bias current. Consequently, the potential of the output terminal 122 is raised. Through these operations, the input threshold of the inverting amplifier 102 becomes equal to the reference input voltage $V_1$ inputted to the negative input terminal of the differential amplifier 103. Namely, as shown in FIG. 9, the coordinate of the intersection of the transfer curve 403 of the inverting amplifier 102 and the line on which $V_2 = V_{out}$ is represented by ($V_1$, $V_1$). As is apparent from FIG. 7, if the reference input voltage is $V'_1$ which is a little smaller than $V_1$, the transfer curve of the inverting amplifier 102 will be the curve represented by two dot chain lines in FIG. 9, and the threshold voltage from the inverting amplifier 102 converges to $V'_1$. If the reference input voltage is $V''_1$ which is a little larger than $V_1$, the transfer curve will be the curve represented by a chain dotted line of FIG. 9, and the threshold voltage from the inverting amplifier 102 converges to $V''_1$.

If the inverting amplifier 101 has the same transfer curve as the inverting amplifier 102, the input threshold of the inverting amplifier 101 converges to the same value as the reference input voltage $V_1$. Therefore, when the external input voltage $V_2$ applied to the input terminal 111 of the inverting amplifier 101 is larger than $V_1$ ($V_2 > V_1$), the output voltage $V_{out}$ from the output terminal 112 sways from $V_1$ to the negative direction in FIG. 9, and when $V_2 < V_1$, the output voltage $V_{out}$ sways from $V_1$ to the positive direction in FIG. 9. In other words, the threshold which is the reference for determining the magnitude of the external input voltage $V_2$ can be controlled by the magnitude of the reference input voltage $V_1$, and therefore, the output voltage $V_{out}$ of the inverting amplifier 101 is the result of comparison of $V_1$ with $V_2$ represented by a digital value.

The comparing means is formed by the said differential amplifier 103, which receives the reference input voltage and a feedback input voltage, compares the both input voltages to output a predetermined control voltage. Voltage responding means is formed by the said inverting amplifier 101 which has a predetermined first threshold and receives said control voltage from said comparing means and an external input voltage, said first threshold for determining magnitude of the external input voltage being controlled by said control voltage. Threshold corresponding voltage output means is formed by the said inverting amplifier 102 which has a predetermined second threshold, receives said control voltage outputted from said comparing means for outputting threshold corresponding voltage whose value corresponds to said second threshold, said second threshold being controlled by said control voltage while maintaining a predetermined relation with said first threshold of said voltage responding means, and feeds back said threshold voltage to said comparing means as said feed back voltage. In addition, a feed back loop is formed by the closed loop including the inverting amplifier 102 which feeds back the said threshold corresponding voltage outputted from the said threshold corresponding voltage output means to the said comparing means as the feed back voltage for controlling the said control voltage such that the said first threshold of the said voltage responding means converges to a desired value.

The controlled threshold type electric device shown in FIG. 8 may be applied to a comparator 500 which is employed as the A/D converter shown in FIG. 7 and the like. More specifically, each of the plurality of comparators 500 shown in FIG. 7 is formed by the controlled threshold type electric device shown in FIG. 8. The reference input voltage from the reference voltage 504 is inputted to the negative input terminal of the differential amplifier 103, and the external input voltage, which is an analog voltage inputted from an analog input portion 506 is inputted to the input terminal 111. Then, the output voltage $V_{out}$ representing the result of determination of the magnitude of the external input voltage $V_2$ based on the input threshold is outputted from the output terminal 112. When the circuit shown in FIG. 8 is used as the comparator 500, the external input voltage magnitude determining means is formed by the inverting amplifier 101, which has a predetermined logic determining threshold, receives the said control voltage from the said comparing means and the external input voltage, and outputs the result of determination of the magnitude of the said external input voltage with the said logic determining threshold being the reference, the said logic determining threshold being controlled by the said inputted control voltage.

FIG. 10 is a circuit diagram showing an improvement of the controlled threshold type electric device shown in FIG. 8. The controlled threshold type electric device shown in FIG. 10 can output an output signal Vout having a larger amplitude than that of FIG. 8. In the controlled threshold type electric device shown in FIG. 10, inverting amplifiers 101 and 102 are constituted of first voltage controlled current sources 115 and 125 and second voltage controlled current sources 114 and 124, respectively. The first voltage controlled current sources 115 and 125 each comprise a series connection of two N-channel MOS transistors 115a and 115b, and 125a and 125b, respectively. The second voltage controlled current sources 114 and 124 each comprise a series connection of two P-channel MOS transistors 114a and 114b, and 124a and 124b, respectively. What is different in structure from FIG. 8 is that while the voltage controlled current sources in FIG. 8 are each comprised of a single transistor, those in FIG. 10 are each comprised of a plurality of transistors. In addition, the electric device of FIG. 10 is provided with a bias voltage generating circuit 600. The bias voltage generating circuit 600 applies a bias voltage $V_{bp}$ to the respective gates of the transistors 114b and 124b, and another bias voltage $V_{bn}$ to the respective gates of the transistors 115a and 125a. In the diagram, reference numerals 605 and 606 represent the respective output terminals of the bias voltage generating circuit 600. The control threshold type electric device shown in FIG. 10 comprises a differential amplifier 103 which can be also manufactured through the MOS standard process.

The amplification factor AN of the output voltage Vout from the controlled threshold type electric device shown in FIG. 10 is given by the following expression, as previously described.

$$AN = \frac{\Delta V_{out}}{\Delta V_2} = \frac{Gm1}{Go1 + Go2}$$

As shown in FIG. 10, when each of the voltage controlled current sources 114, 115, 124 and 125 comprises a multiple-transistor type voltage controlled current source having a plurality of transistors connected in series, the value of Go1+Go2 is much smaller than when it is constituted of a single transistor. As a result, the value AN becomes large.

Figure 12:
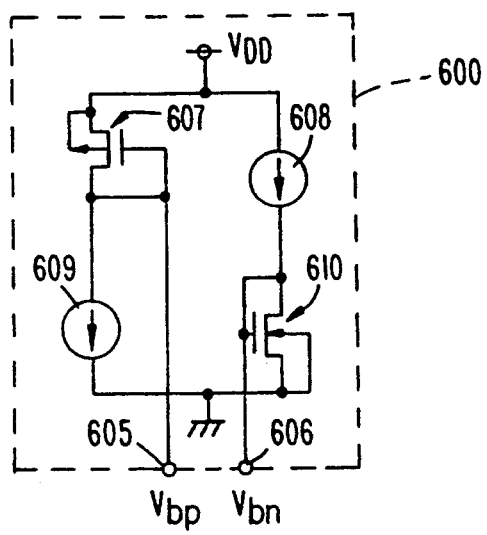
Figure 13:
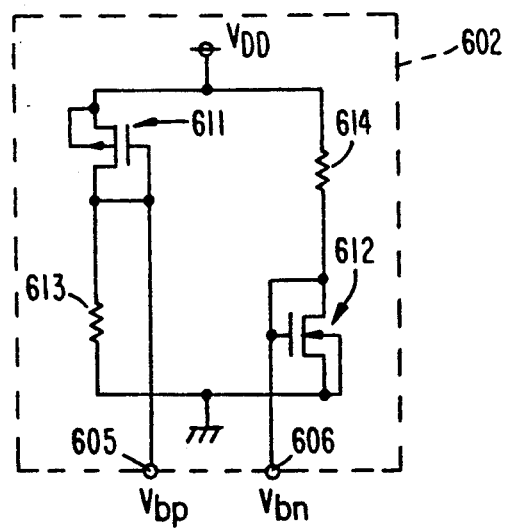

FIG. 11 is a circuit diagram showing specific structure of the bias voltage generating circuit 600 shown in FIG. 10. FIGS. 12 and 13 are circuit diagrams showing other examples of the bias voltage generating circuit 600 shown in FIG. 11.

Referring to FIG. 11, the bias voltage generating circuit 600 is a so-called resistance dividing type voltage generating circuit which comprises resistors 601, 602, 603 and 604. According to resistance values of the respective resistors, the bias voltages $V_{bp}$ and $V_{bn}$ are generated at the output terminals 605 and 606, respectively.

The bias voltage generating circuit 600 shown in FIG. 12 comprises a P-channel MOS transistor 607, an N-channel MOS transistor 610 and constant current generating circuits 608 and 609. Through this structure, the bias voltage $V_{bp}$ is generated at the output terminal 605 and the bias voltage $V_{bn}$ is generated at the other output terminal 606.

The bias voltage generating circuit 600 shown in FIG. 13 comprises a P-channel MOS transistor 611, an N-channel MOS transistor 612 and resistors 613 and 614. Through this structure, the bias voltage $V_{bp}$ is generated at an output terminal 605 and the bias voltage $V_{bn}$ is generated at another terminal 606.

Figure 14:
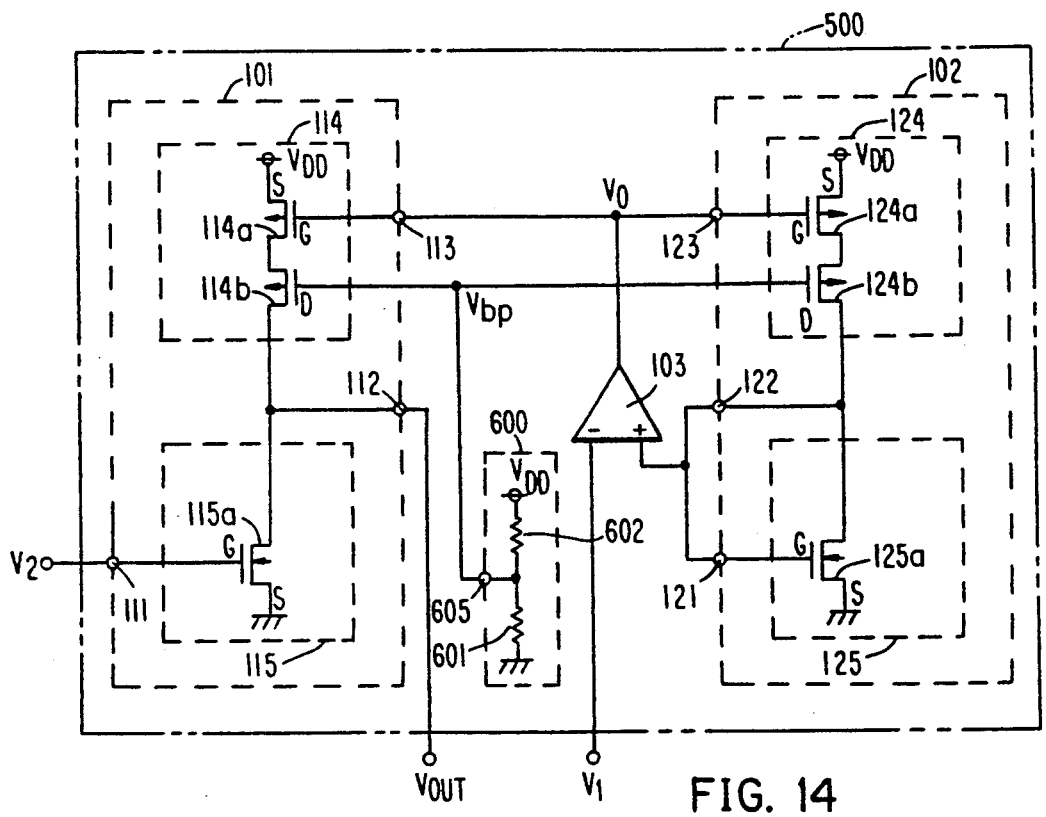
FIG. 14 is a circuit diagram showing the controlled threshold type electric device according to the present invention and another example of comparator employing the same.
Figure 20:
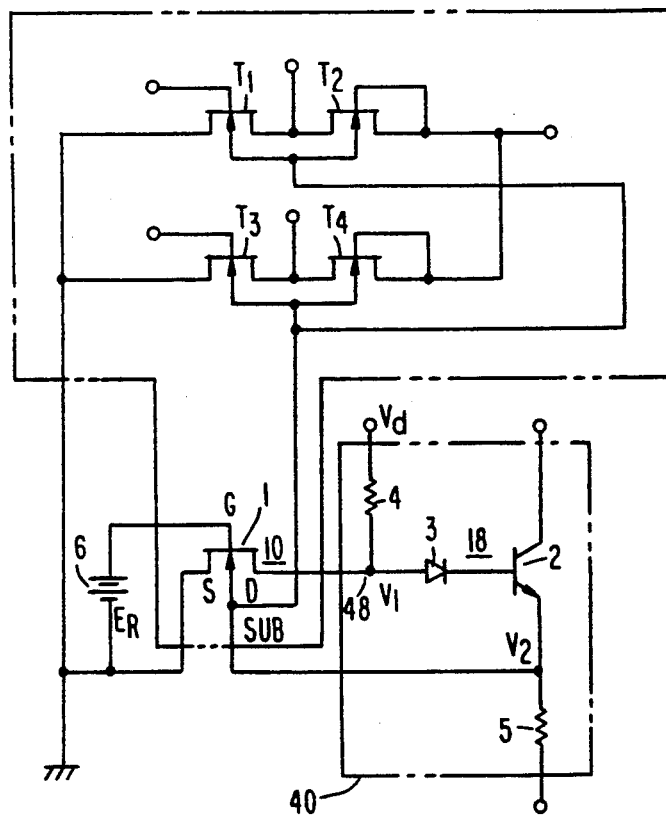
FIG. 20 is a circuit diagram showing a conventional controlled threshold type electric device.
Figure 21:
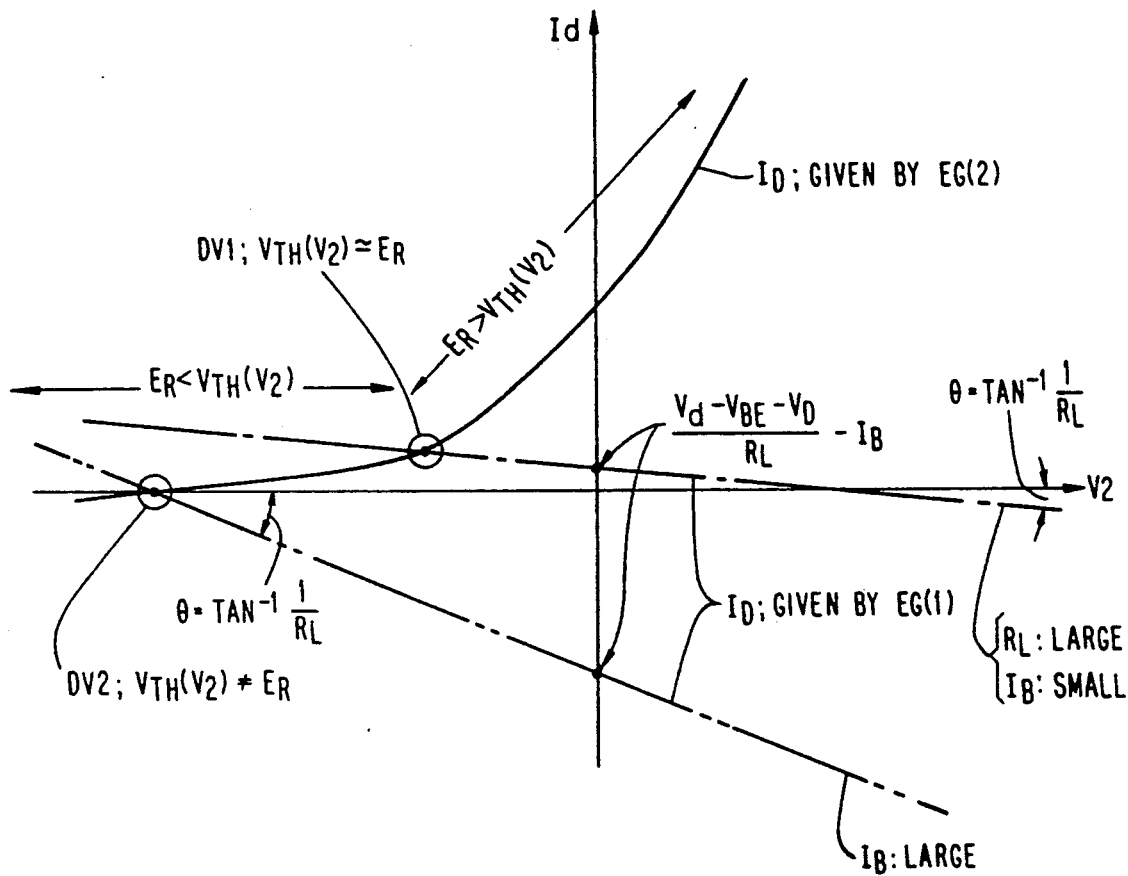
FIG. 21 is a diagram showing operation characteristics of the conventional controlled threshold type electric device shown in FIG. 20.
Figure 15:
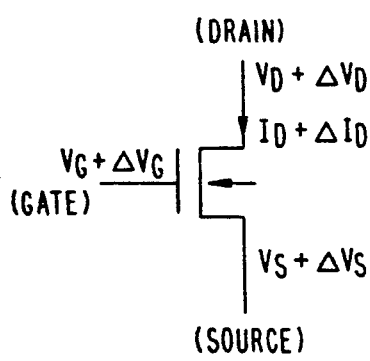
FIGS. 15 to 19 are diagrams for explaining the amplification factor of a general inverting amplifier.
Figure 16:
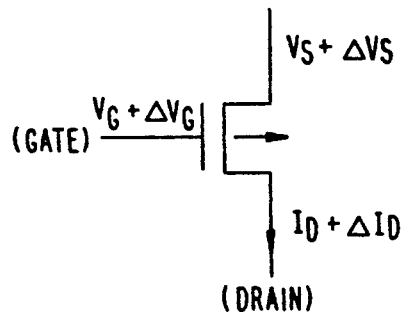
Figure 17:
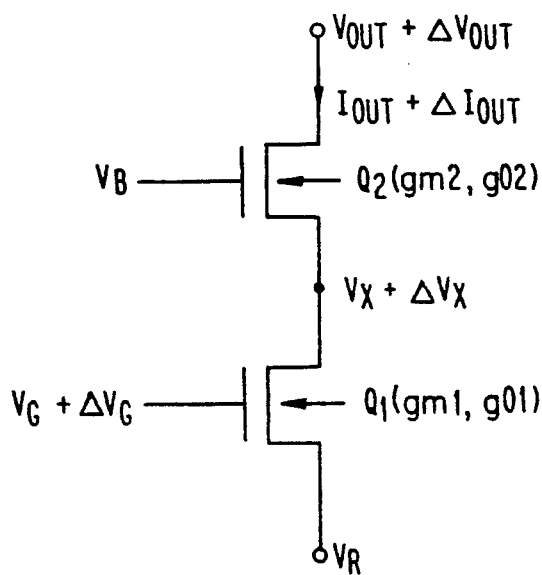
Figure 18:
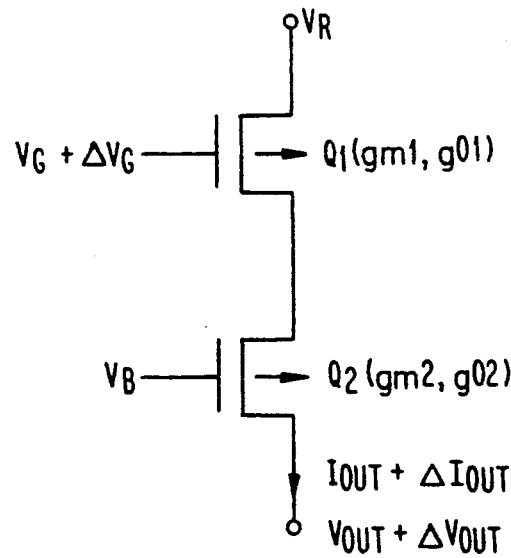
Figure 19:
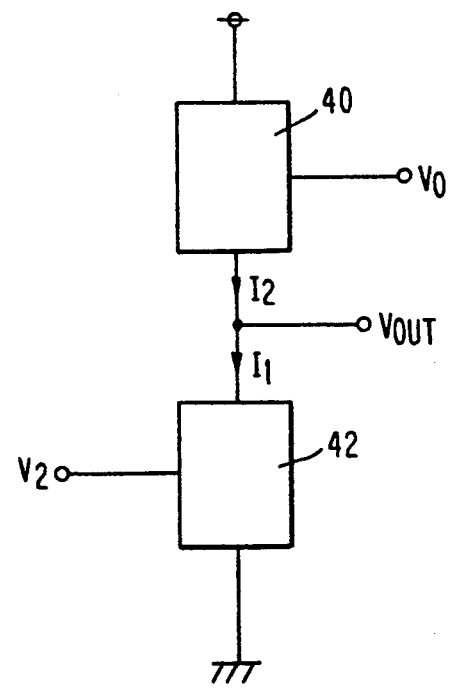

FIG. 14 is a circuit diagram showing another example obtained by modifying the controlled threshold type electric device shown in FIG. 10. What is different from the controlled threshold type electric device shown in FIG. 10 is that each of the voltage controlled current sources 115 and 125 is constituted of a single transistor, i.e., 115a and 125a. In addition, the bias voltage generating circuit 600 is constituted of two resistors 601 and 602. The bias voltage $V_{bp}$ generated at the output terminal 605 of this bias voltage generating circuit 600 is applied to the respective gates of the transistors 114b and 124b. The bias voltage generating circuit 600 shown in FIG. 14 is, like that shown in FIG. 11, of the so-called resistance dividing type. This resistance dividing type bias voltage generating circuit 600 in FIG. 14 may be replaced by that type of bias voltage generating circuit shown in FIG. 12 or 13.

The controlled threshold type electric device shown in FIG. 10 or 14 may be applied, for example, to the comparator 500 used in the A/D converter shown in FIG. 7 or the like.

While in the embodiments described above, the voltage responding means or external input voltage magnitude determining means and the threshold corresponding voltage output means have the same transfer characteristic, any other such means may be available if only the above-described threshold value for determining logical level and the above-mentioned threshold value can be controlled by the control voltage, maintaining a certain relationship with each other. Further, while in the devices shown in FIGS. 8, 10 and 14, the bias current generating means is constituted of P-channel MOS transistors and the driving current generating means is constituted of N-channel MOS transistors, transistors of the opposite conductivity-type to the case above may be applied to the respective means, or alternatively, not those MOS transistors but, for example, bipolar transistors, JFETs or the like may be applied to those means. Furthermore, the voltage controlled current sources in FIGS. 8, 10 and 14 may have passive elements mixed therein.

What is claimed is:

1. A controlled threshold type electric device comprising:
   a differential amplifier receiving a reference input voltage and a feedback input voltage, for amplifying a difference between said input voltages and for outputting a result of the amplification as a control voltage;
   a first transistor including a front gate and a back gate and first and second conductive terminals, and having a predetermined first threshold value, said control voltage being inputted to said back gate, said first threshold value being controlled by said inputted control voltage, and said first and second conductive terminals being put in conductive and non-conductive states with respect to each other depending on a relation of magnitude between a voltage inputted to said front gate and said first threshold value;
   a second transistor including a front gate and a back gate and first and second conductive terminals, and having a predetermined second threshold value, an input voltage being inputted to said front gate of said second transistor, said control voltage being inputted to said back gate of said second transistor, said second threshold value being controlled by said inputted control voltage while maintaining a predetermined relation with said first threshold value, and said first and second conductive terminals being put in conductive and non-conductive states with respect to each other depending on a relation of magnitude of said input voltage inputted to said front gate and said second threshold value; and
   threshold corresponding voltage applying means for applying a voltage corresponding to said first threshold value of said first transistor to said differential amplifier as said feedback input voltage,
   said threshold corresponding voltage applying means including current supplying means having a node connected to one of said first and second conductive terminals and to said front gate of said first transistor for supplying a small current to flow between the first and second conductive terminals of said first transistor, said current having a magnitude selected to cause a voltage between the front gate and the other conducting terminal of the first transistor to be substantially equal to the first threshold value and applying a voltage generated at said node by said current flow to said differential amplifier as a feedback input voltage.

2. A controlled threshold type electric device according to claim 1, wherein
   said current supplying means includes a constant current source which supplies a substantially constant current to said node.

3. A controlled threshold type electric device according to claim 1, wherein
   said current supplying means comprises an input terminal receiving a predetermined voltage, and a predetermined resistor provided between said input terminal and said node, for supplying a current to said node obtained through a voltage drop caused when current flows through said resistor.

4. A controlled threshold type electric device comprising:
   comparing means having first and second input portions for comparing a reference input voltage inputted to said first input portion with a feedback input voltage inputted to said second input portion and outputting a predetermined control voltage;
   a first amplifier for receiving said control voltage from said comparing means and an external input voltage, and outputting a predetermined output voltage; and
   a second amplifier having a transfer characteristic similar to that of said first amplifier, for receiving said control voltage from said comparing means and outputting a predetermined output voltage to said comparing means as said feedback input voltage,
   said first amplifier including a series circuit which comprises a series connection of a first voltage controlled current source receiving a control voltage including said control voltage from said comparing means, and providing a current controlled by said received control voltage, and a second voltage controlled current source receiving a control voltage including said external input voltage and providing a current controlled by said received control voltage, said first amplifier outputting said predetermined output voltage from a connection node between said first and second voltage controlled current sources of said first amplifier,
   said second amplifier including a series circuit which comprises a series connection of a first voltage controlled current source receiving a control voltage including said control voltage from said comparing means and providing a current controlled by said received control voltage, and a second voltage controlled current source having a control voltage input portion and providing a current controlled by a control voltage including a voltage applied to said control voltage input portion, and a node between said first and second voltage controlled current sources of said second amplifier, together with a conductive path for applying a voltage generated at said node to said control voltage input portion and to said second input portion of said comparing means as said feedback input voltage, and
   at least one of said voltage controlled current sources included in said first and second amplifiers comprising a multiple-transistor type voltage controlled current source having a plurality of transistors connected in series.

5. A controlled threshold type electric device according to claim 4, wherein
   said first and second voltage controlled current sources included in said first and second amplifiers each comprises a multiple-transistor type voltage controlled current source.

6. A controlled threshold type electric device according to claim 4, wherein
   said comparing means includes a differential amplifier which amplifies a difference of the two voltages inputted thereto and outputs a result of the amplification.

7. A controlled threshold type elastic device according to claim 4, wherein
   said first voltage controlled current source of at least one of said first and second amplifiers includes a first transistor of a first conductivity-type and said second voltage controlled current source of said at least one of said amplifiers includes a second transistor of a second conductivity type opposite to the first conductivity type of said first transistor.

8. A comparator receiving a reference input voltage and an external input voltage for comparing said reference input voltage and said external input voltage and outputting a result of the comparison, comprising:

comparing means, having a first input portion receiving said reference input voltage and a second input portion receiving a feedback input voltage, for comparing said reference input voltage received by said first input portion and said feedback input voltage received by said second input portion and providing a predetermined control voltage;

a first amplifier receiving said control voltage from said comparing means and said external input voltage for providing a predetermined output voltage; and a second amplifier having a transfer characteristic similar to that of said first amplifier, for receiving said control voltage from said comparing means and providing a predetermined output voltage to said second input portion of said comparing means as said feedback input voltage, said first amplifier including a series circuit which comprises a series connection of a first voltage controlled current source receiving a control voltage including said control voltage from said comparing means and providing a current controlled by said received control voltage, and a second voltage controlled current source receiving a control voltage including said external input voltage and providing a current controlled by said received control voltage, said first amplifier providing said predetermined output voltage from a connection node between said first and second voltage controlled current sources of said first amplifier, said second amplifier including a series circuit which comprises a series connection of a first voltage controlled current source receiving a control voltage including said control voltage from said comparing means and providing a current controlled by said received control voltage, and a second voltage controlled current source having a control voltage input portion and providing a current controlled by a control voltage including a voltage applied to said control voltage input portion, and a node between said first and second voltage controlled current sources of said second amplifier, together with a conductive path for applying a voltage generated at said node as said feedback input voltage, and at least one of said voltage controlled current sources included in said first and second amplifiers comprising a multiple-transistor type voltage controlled current source having a plurality of transistors connected in series.

9. A comparator according to claim 8, wherein said first and second voltage controlled current sources included in said first and second amplifiers each comprises a multiple-transistor type voltage controlled current source.

10. A comparator according to claim 8, wherein said comparing means includes a differential amplifier which amplifies a difference to two input voltages and outputs a result of the amplification.

11. A comparator according to claim 8, wherein said first voltage controlled current source of at least one of said first and second amplifiers includes a first transistor of a first conductivity type and said second voltage controlled current source of said at least one of said amplifiers includes a second transistor of a second conductivity type opposite to the first conductivity type of said first transistor.

12. A controlled threshold type electric device according to claim 4, wherein said first voltage controlled current source of said first amplifier comprises a multiple-transistor type current source including a series connection of first and second transistors, said first transistor connected for receiving said control voltage from said comparing means and connected to a first voltage source, said second transistor connected between said first transistor and said second voltage controlled current source of said first amplifier, and further comprising:

biasing means generating a first bias voltage for biasing said second transistor of said first voltage controlled current source of said first amplifier.

13. A controlled threshold type electric device according to claim 12, wherein said second voltage controlled current source of said first amplifier comprises a multiple-transistor type current source including a series connection of first and second transistors having opposite conductivity channels to said first and second transistors of said first voltage controlled current source, said first transistor of said second voltage controlled current source connected for receiving said external input voltage and connected to a second voltage source, said second transistor of said second voltage controlled current source connected between said first transistor and said first voltage controlled current source of said first amplifier, wherein said biasing means generates a second bias voltage for biasing said second transistor of said second voltage controlled current source of said first amplifier.

14. A controlled threshold type electric device according to claim 13, wherein said first voltage controlled current source of said second amplifier comprises a multiple-transistor type current source including a series connection of first and second transistors, said first transistor connected for receiving said control voltage from said comparing means and connected to said first voltage source, said second transistor connected between said first transistor and said second voltage controlled current source of said second amplifier, and wherein said second voltage controlled current source of said second amplifier comprises a multiple-transistor structure including a series connection of first and second transistors having opposite conductivity channels to said first and second transistors of said first voltage controlled current source of said second amplifier, said first transistor of said second voltage controlled current source of said second amplifier having: a gate connected to said node for providing said feedback input voltage to said second input portion of said comparing means; and a connection to said second voltage source, said second transistor of said second voltage controlled current source of said second amplifier connected to said first transistor thereof and to said node, said biasing means providing said first biasing voltage to said second transistor of said first voltage controlled current source in said second amplifier and further providing said second biasing voltage to said second transistor of said second voltage controlled current source in said second amplifier.

15. A controlled threshold type electric device according to claim 12, wherein said first voltage controlled current source of said second amplifier comprises a multiple-transistor type current source including a series connection of first and second transistors,
   said first transistor connected for receiving said control voltage from said comparing means and connected to said first voltage source, said second transistor connected between said first transistor and said second voltage controlled current source of said second amplifier, and
   said biasing means providing said first biasing voltage to said second transistor of said first voltage controlled current source in said second amplifier.

16. A controlled threshold type electric device comprising:
   comparing means having first and second input portions for comparing a reference input voltage inputted to said first input portion with a feedback input voltage inputted to said second input portion and for outputting a predetermined control voltage;
   a first amplifier means receiving said control voltage from said comparing means and receiving an input voltage, said first amplifier means operating for outputting predetermined output voltage at an output node,
   said first amplifier means having a first transistor connected between a first potential node and said output node, and a second transistor connected between a second potential node and said output node, a control electrode of said first transistor receiving said control voltage from said comparing means, a control electrode of said second transistor receiving said input voltage, and
   a second amplifier means for receiving said control voltage from said comparing means and outputting said feedback input voltage at a feedback node,
   said second amplifier means having a third transistor connected between said first potential node and said feedback node, and a fourth transistor connected between said second potential node and said feedback node, a control electrode of said third transistor receiving said control voltage from said comparing means, a control electrode of said fourth transistor connected to said feedback node.

17. A controlled threshold type electric device according to claim 16, wherein said first and third transistors are p-channel type MOS transistors, and said second and fourth transistors are n-channel type MOS transistors.

18. A controlled threshold type electric device according to claim 16, wherein said first amplifier means further includes a fifth transistor connected between said first transistor and said output node, and a sixth transistor connected between said second transistor and said output node, and
   said second amplifier means further includes a seventh transistor connected between said third transistor and said feedback node, and an eighth transistor connected between said fourth transistor and said feedback node.

19. A controlled threshold type electric device according to claim 18, wherein said fifth and seventh transistors each have a control electrode connected to a third potential node, and said sixth and eighth transistors each have a control electrode connected to a fourth potential node.

20. A controlled threshold type electric device according to claim 18, wherein said first, third, fifth and seventh transistors are p-channel type MOS transistors, and said second fourth, sixth and eighth transistors are n-channel type MOS transistors.

21. A controlled threshold type electric device comprising:
   comparing means having first and second input portions for comparing a reference input voltage inputted to said first input portion with a feedback input voltage inputted to said second input portion and outputting a predetermined control voltage;
   a first amplifier for receiving said control voltage from said comparing means and an external input voltage, and outputting a predetermined output voltage; and
   a second amplifier having a transfer characteristic similar to that of said first amplifier, for receiving said control voltage from said comparing means and outputting a predetermined output voltage to said comparing means as said feedback input voltage,
   said first amplifier including a series circuit which comprises a series connection of a first voltage controlled current source receiving a control voltage including said control voltage from said comparing means, and providing a current controlled by said received control voltage, and a second voltage controlled current source receiving a control voltage including said external input voltage and providing a current controlled by said received control voltage, said first amplifier outputting said predetermined output voltage from a connection node between said first and second voltage controlled current sources of said first amplifier,
   said second amplifier including a series circuit which comprises a series connection of a first voltage controlled current source receiving a control voltage including said control voltage from said comparing means and providing a current controlled by said received control voltage, and a second voltage controlled current source having a control voltage input portion and providing a current controlled by a control voltage including a voltage applied to said control voltage input portion, and a node between said first and second voltage controlled current sources of said second amplifier, together with a conductive path for applying a voltage generated at said node to said control voltage input portion and to said second input portion of said comparing means as said feedback input voltage.

22. A controlled threshold type electric device as recited in claim 21, wherein said first and second voltage controlled current sources of said first amplifier comprise first and second field effect transistors each having a respective gate terminal, and said first and second voltage controlled current sources of said second amplifier comprise third and fourth field effect transistors each having a respective gate terminal.
   said fourth field effect transistor has a drain terminal connected to said node providing said feedback input voltage, and
   said gate terminal of said fourth field effect transistor is connected to said drain terminal thereof, 23. A controlled threshold type electric device as recited in claim 22, wherein said gate terminals of said first and third field effect transistors comprise respective front and back gate terminals and said control voltage outputted by said comparing means is applied to said front gate terminals of said first and third field effect transistors.

24. A controlled threshold type electric device as recited in claim 21, wherein said first and second voltage controlled current sources of said first amplifier comprise first and second field effect transistors each having a respective gate terminal, and said first and second voltage controlled current sources of said second amplifier comprise third and fourth field effect transistors each having a respective gate terminal, said gate terminals of said first and third field effect transistors comprise respective front and back gate terminals and said control voltage outputted by said comparing means is applied to said front gate terminals of said first and third field effect transistors, at least one of said voltage controlled current sources included in said first and second amplifiers comprising a plurality of transistors connected in series.

* * * * *